United States Patent
Gstrein et al.

(10) Patent No.: US 12,506,032 B2
(45) Date of Patent: Dec. 23, 2025

(54) SELF-ASSEMBLED GUIDED HOLE AND VIA PATTERNING OVER GRATING

(71) Applicant: Intel Corporation, Santa Clara, CA (US)

(72) Inventors: Florian Gstrein, Portland, OR (US); Eungnak Han, Portland, OR (US); Manish Chandhok, Beaverton, OR (US); Gurpreet Singh, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/655,567

(22) Filed: May 6, 2024

(65) Prior Publication Data

US 2024/0290651 A1    Aug. 29, 2024

Related U.S. Application Data

(63) Continuation of application No. 17/559,490, filed on Dec. 22, 2021, now Pat. No. 12,230,536.

(51) Int. Cl.
*H01L 21/768* (2006.01)
*H01L 23/522* (2006.01)

(52) U.S. Cl.
CPC .... *H01L 21/7681* (2013.01); *H01L 21/76816* (2013.01); *H01L 23/5226* (2013.01); *H01L 2221/1036* (2013.01)

(58) Field of Classification Search
CPC ......... H01L 21/76816; H01L 21/76897; H01L 2221/1036; H01L 2221/1026; H01L 21/7681

See application file for complete search history.

(56) References Cited

U.S. PATENT DOCUMENTS

| 10,937,801 B2* | 3/2021 | Otsu ..................... H10B 41/41 |
| 2013/0044205 A1* | 2/2013 | Matsumoto .............. H04N 7/18 382/141 |
| 2019/0237329 A1* | 8/2019 | Krysak ..................... C01F 7/00 |
| 2021/0296324 A1* | 9/2021 | Lim ................... H01L 21/31116 |

* cited by examiner

*Primary Examiner* — John A Bodnar
(74) *Attorney, Agent, or Firm* — Akona IP PC

(57) ABSTRACT

Described herein are IC devices include vias deposited in a regular array, e.g., a hexagonal array, and processes for depositing vias in a regular array. The process includes depositing a guiding pattern over a metal grating, depositing a diblock copolymer over the guiding pattern, and causing the diblock copolymer to self-assemble such one polymer forms an array of cylinders over metal portions of the metal grating. The polymer layer can be converted into a hard mask layer, with one hard mask material forming the cylinders, and a different hard mask material surrounding the cylinders. A cylinder can be selectively etched, and a via material deposited in the cylindrical hole to form a via.

20 Claims, 27 Drawing Sheets

| | 302 |
| | 304 |
| | 306 |
| | 390 |
| | 392 |
| | 394 |

| | 302 |
| | 304 |
| | 306 |
| | 390 |
| | 392 |
| | 396 |

| | |
|---|---|
| ☐ | 302 |
| ▦ | 304 |
| ▨ | 306 |
| ≈ | 390 |
| ▦ | 392 |
| ∿ | 396 |
| ▦ | 398 |

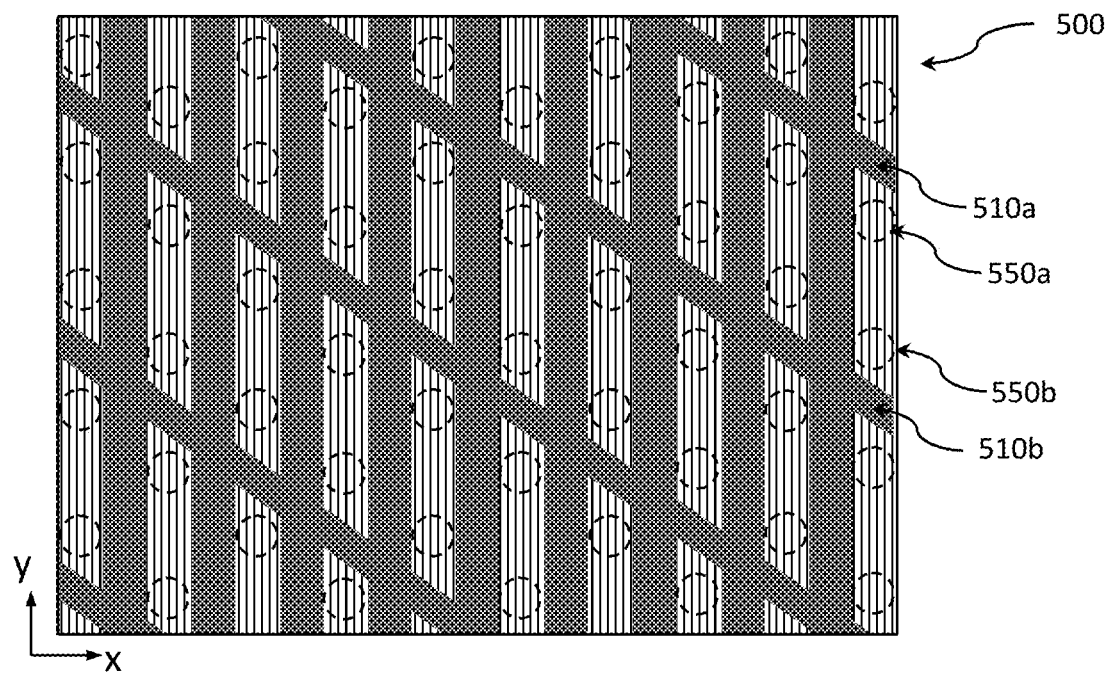
FIG. 5
 308
 310

SELF-ASSEMBLED GUIDED HOLE AND VIA PATTERNING OVER GRATING

CROSS-REFERENCE TO RELATED APPLICATIONS

This Application is a continuation (and claims the benefit of priority under 35 U.S.C. § 120) of U.S. patent application Ser. No. 17/559,490, filed Dec. 22, 2021, issued as U.S. Pat. No. 12,230,536, and entitled SELF-ASSEMBLED GUIDED HOLE AND VIA PATTERNING OVER GRATING, the content of which is hereby incorporated by reference in its entirety.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for the ever-increasing capacity, however, is not without issue. The necessity to optimize the performance of each device and each interconnect becomes increasingly significant.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 5 illustrates a third example guiding pattern for generating an aligned hexagonal array, according to some embodiments of the present disclosure.

DETAILED DESCRIPTION

Overview

Figure 1:
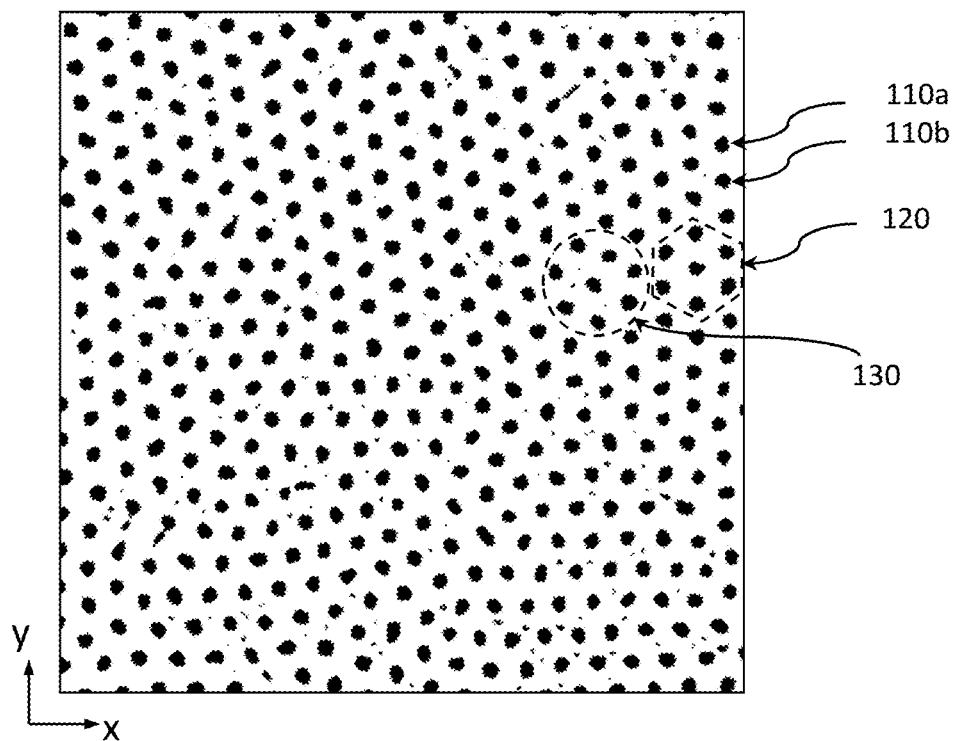
FIG. 1 is an example of an array of cylindrical structures formed using directed self-assembly (DSA) without a guiding pattern, according to some embodiments of the present disclosure.

Integrated circuits commonly include electrically conductive microelectronic structures, which are known in the arts as vias, to electrically connect metal lines or other interconnects above the vias to metal lines or other interconnects below the vias. Vias are typically formed by a lithographic process. For example, a photoresist layer may be spin coated over a dielectric layer, the photoresist layer may be exposed to patterned actinic radiation through a patterned mask, and then the exposed layer may be developed to form an opening in the photoresist layer. Next, an opening for the via may be etched in the dielectric layer by using the opening in the photoresist layer as an etch mask. This opening is referred to as a via opening. An example via opening is a contact hole. Finally, the via opening may be filled with one or more metals or other conductive materials to form the via. The via may be a plating through via, blind via (e.g., a via connecting the outermost circuit of a printed circuit board (PCB) and the adjacent inner layer), buried via (e.g., a via connecting circuit layers of a PCB but not passing to the outer layer of the PCB), or other types of vias.

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension (e.g., a diameter or some other transverse cross-sectional dimension) of the via opening. Another measure of the spacing of the vias is the via pitch, representing the center-to-center distance between the closest adjacent vias.

When patterning extremely small vias with extremely small pitches by such lithographic processes, several challenges present themselves. One such challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment.

Another such challenge is that the critical dimensions of the via openings generally tend to scale faster than the resolution capabilities of the lithographic scanners. Via opening rectification technologies exist to reduce the critical dimensions of the via openings. However, the reduced amount tends to be limited by the minimum via pitch, as well as by the ability of the via opening rectification process to be sufficiently optical proximity correction (OPC) neutral, and to not significantly compromise line width roughness (LWR) and/or critical dimension uniformity (CDU).

Yet another such challenge is that the LWR and/or CDU characteristics of photoresists generally need to improve as the critical dimensions of the via openings decrease to maintain the same overall fraction of the critical dimension budget. However, currently the LWR and/or CDU characteristics of most photoresists are not improving as rapidly as the critical dimensions of the via openings are decreasing.

A further such challenge is that the extremely small via pitches generally tend to be below the resolution capabilities of even extreme ultraviolet (EUV) lithographic scanners. As a result, commonly two, three, or more different lithographic masks may be used, which tend to increase the costs. At some point, if pitches continue to decrease, it may not be possible, even with multiple masks, to print via openings for these extremely small pitches using EUV scanners. Even though EUV defined via openings offer a lot of design flexibility and helps save number of masks, EUV defined via openings show a lot of variability in LWR and/or CDU due to stochastic nature of the process. The variability increases with decreasing critical dimensions. Additionally, the via opening critical dimensions needed are beyond what EUV can do currently.

A present state of the art method to reduce the critical dimension of EUV holes is to print a relatively large hole and then taper it down to final dimension using etching. Any variability in the starting hole dimension persists post taper and, in some cases, results in missing holes.

The DSA-based approach described herein uses a diblock copolymer deposited over a guiding pattern to generate cylindrical structures for forming contact holes. A diblock copolymer is a polymeric molecule formed of a chain of covalently bonded monomers. In a diblock copolymer, there are two different types of monomers, and these different types of monomers are primarily included within different blocks or contiguous sequences of monomers, e.g., a block of polymer A, and a block of polymer B. The two different monomers making up the diblock copolymer may have different chemical properties, e.g., polymer A may be relatively more hydrophobic, and polymer B may be relatively more hydrophilic.

In many DSA applications, diblock copolymers includes polymer blocks of equal length, e.g., a 1:1 ratio of polymer A to polymer B. In such applications, the diblock copolymer applied and annealed to form a striped arrangement, e.g., alternating stripes of polymer A and polymer B. If the diblock copolymer includes polymer blocks with an unequal ratio (e.g., a 7:3 ratio of polymer A to polymer B), applying and annealing the diblock copolymer results in an array of cylinders. The cylinders have a roughly hexagonal pattern, but the pattern is not regular, and is not aligned to structures underneath the DSA layer. Polymer A and polymer B may each be converted to a different hard mask material prior to forming the vias. Some cylinders of the hard mask converted from polymer B may alternatively be etched and filled with an insulator plug.

As described herein, by applying a guiding pattern below a diblock copolymer layer with an unequal ratio between the two polymers, an array of cylinders generated through DSA are well-aligned to structures below the DSA layer. In particular, the guiding pattern is aligned to the structures below the DSA layer, and the cylinders formed in the DSA layer are aligned to the guiding layer and, thus, to the structures below the DSA layer. For example, if a guiding pattern is applied over a tight-pitched metal grating, the DSA layer formed over the guiding pattern results in an array of cylindrical structures (e.g., cylinders formed from polymer B and surrounded by polymer A), where the cylindrical structures are well-aligned with the metal portions of the metal grating. The DSA layer can then be used to form vias connecting to the structure below, e.g., by etching at least some of the cylinders formed from polymer B and filling the holes with a metal or another conductor.

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. As used herein, a "logic state" (or, alternatively, a "state" or a "bit" value) of a memory cell may refer to one of a finite number of states that the cell can have, e.g., logic states "1" and "0," each state represented by a different voltage of the capacitor of the cell, while "READ" and "WRITE" memory access or operations refer to, respectively, determining/sensing a logic state of a memory cell and programming/setting a logic state of a memory cell. If used, the terms "oxide," "carbide," "nitride," etc. refer to compounds containing, respectively, oxygen, carbon, nitrogen, etc., the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−20% of a target value based on the context of a particular value as described herein or as known in the art.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For convenience, if a collection of drawings designated with different letters are present, e.g., FIGS. 4A-4B, such a collection may be referred to herein without the letters, e.g., as "FIG. 4."

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various IC devices with vias deposited using the DSA process described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

Example Unguided DSA Result

FIG. 1 is an example of an array of cylindrical structures formed using directed self-assembly without a guiding pattern, according to some embodiments of the present disclosure. The image shown in FIG. 1 is a top view of a layer of roughly cylindrical structures, e.g., cylindrical structures 110a and 110b, formed of a first polymer, represented in black, within a second polymer, represented in white. The cylindrical structures 110 are shown from their tops, and the cylinders 110 extend through the layer, e.g., in the z-direction (into the page) in the coordinate system illustrated in FIG. 1.

As noted above, if a DSA process is performed using a diblock copolymer with an uneven ratio between the two polymers, e.g., a 7:3 ratio between the first polymer and a second polymer, the diblock copolymer may self-assemble to form cylindrical structures, such as the structures 110 illustrated in FIG. 1. The cylindrical structures 110 have a roughly hexagonal arrangement, e.g., the seven structures 110 surrounded by the outline 120 are arranged in a hexagon, with one central structure surrounded by six evenly-distributed structures. However, the DSA result shown in FIG. 1 does not have a consistent structure across the array. For example, the area included in the outline 130 has eight cylindrical structures 110 instead of the expected seven. Furthermore, the structures in the outline 130 are slightly offset from the structures in the outline 120, e.g., the structures in the outline 130 are shifted in the y-direction relative to the structures in the outline 120. Moreover, the cylindrical structures 110 are not aligned to structures in a layer below the DSA layer illustrated in FIG. 1. Because the cylindrical structures 110 are not well-aligned with each other or to the layer below, the DSA result illustrated in FIG. 1 may not be suitable for forming a contact hole pattern.

Figure 2:
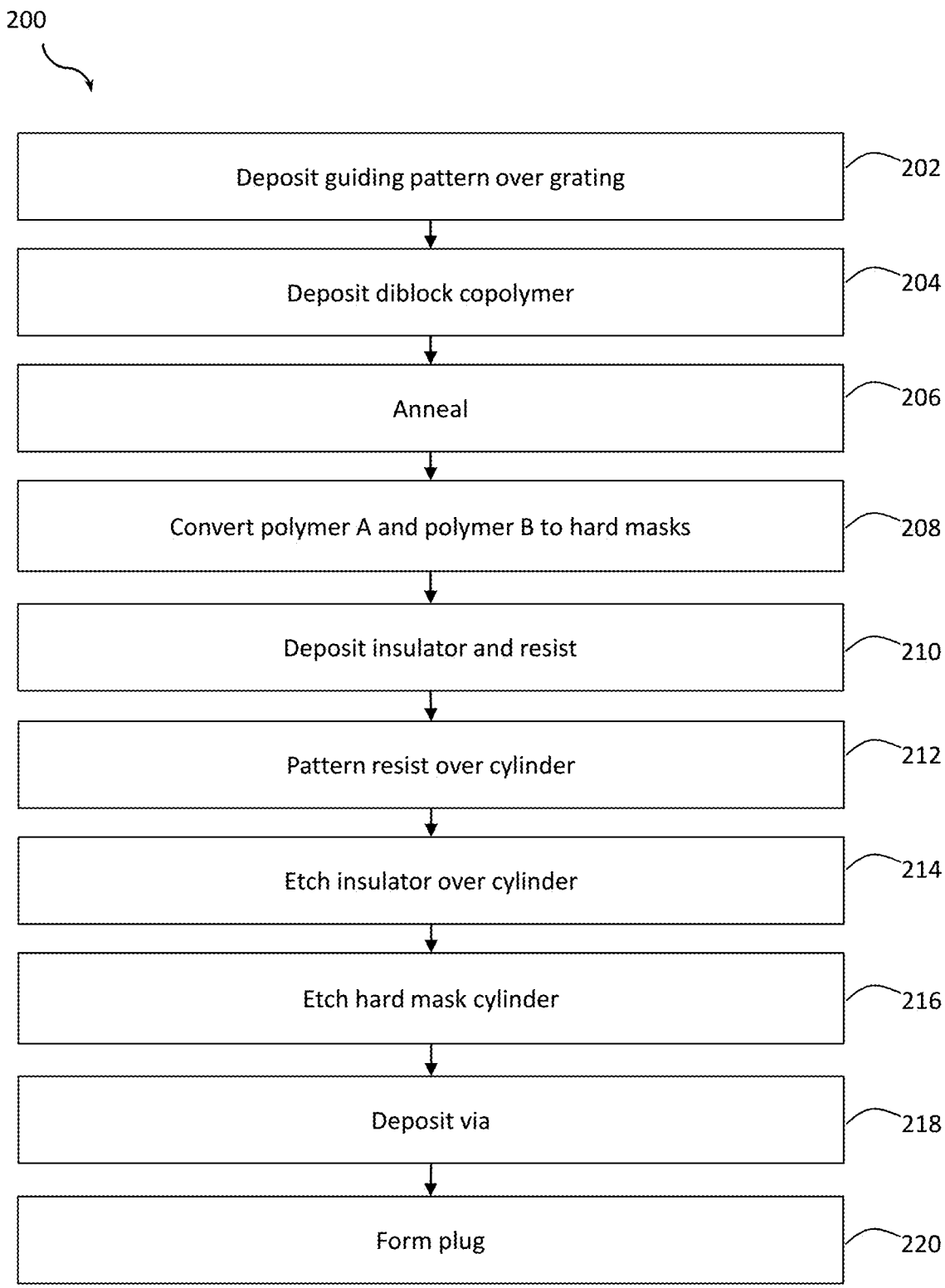
FIG. 2 is a flow chart illustrating a method for generating an aligned hexagonal array using a guiding pattern and forming vias in the hexagonal array, according to some embodiments of the present disclosure.

Example Process for Generating an Aligned Hexagonal Array Using a Guiding Pattern FIG. 2 is a flow chart illustrating a method 200 for generating an aligned hexagonal array using a guiding pattern and forming vias in the hexagonal array, according to some embodiments of the present disclosure. FIGS. 3A-3K illustrate various stages in the process of generating the aligned hexagonal array and forming vias in the hexagonal array according to the method of FIG. 2, according to some embodiments of the present disclosure. More specifically, FIGS. 3A-3K illustrate top-down and cross-sectional side views for various stages in the process of generating the aligned hexagonal array according to the method 200. In particular, each of FIGS. 3A-3K shows, at the top of the page of the drawing, a top-down view (i.e., a view in a x-y plane) of an IC structure; in the middle of the page of the drawing, a cross-section side view of the IC structure with the cross-section taken along an x-z plane AA' of the reference coordinate system x-y-z shown in FIGS. 3A-3K; and, at the bottom of the page of the drawing, a cross-section side view of the IC structure with the cross-section taken along a y-z plane BB' of the reference coordinate system x-y-z shown in FIGS. 3A-3K.

A number of elements referred to in the description of FIGS. 3A-3K with reference numerals are illustrated in these figures with different patterns, with a legend showing the correspondence between the reference numerals and patterns being provided at the bottom of each drawing page containing FIGS. 3A-3K. For example, the legend illustrates that FIGS. 3A-3K use different patterns to show a support structure 302, an insulator 304, and an electrically conductive material 306. Furthermore, although a certain number of a given element may be illustrated in some of FIGS. 3A-3K (e.g., fourteen cylindrical structures in FIG. 3D, and one example via and one example plug in FIGS. 3J and 3K), this is simply for ease of illustration, and more, or less, than that number may be included in an IC structure according to various embodiments of the present disclosure. Still further, various IC structure views shown in FIGS. 3A-3K are intended to show relative arrangements of various elements therein, and that various IC structures, or portions thereof, may include other elements or components that are not illustrated (e.g., transistor portions, various components that may be in electrical contact with the capacitor or contacts, etc.).

Figure 3A:
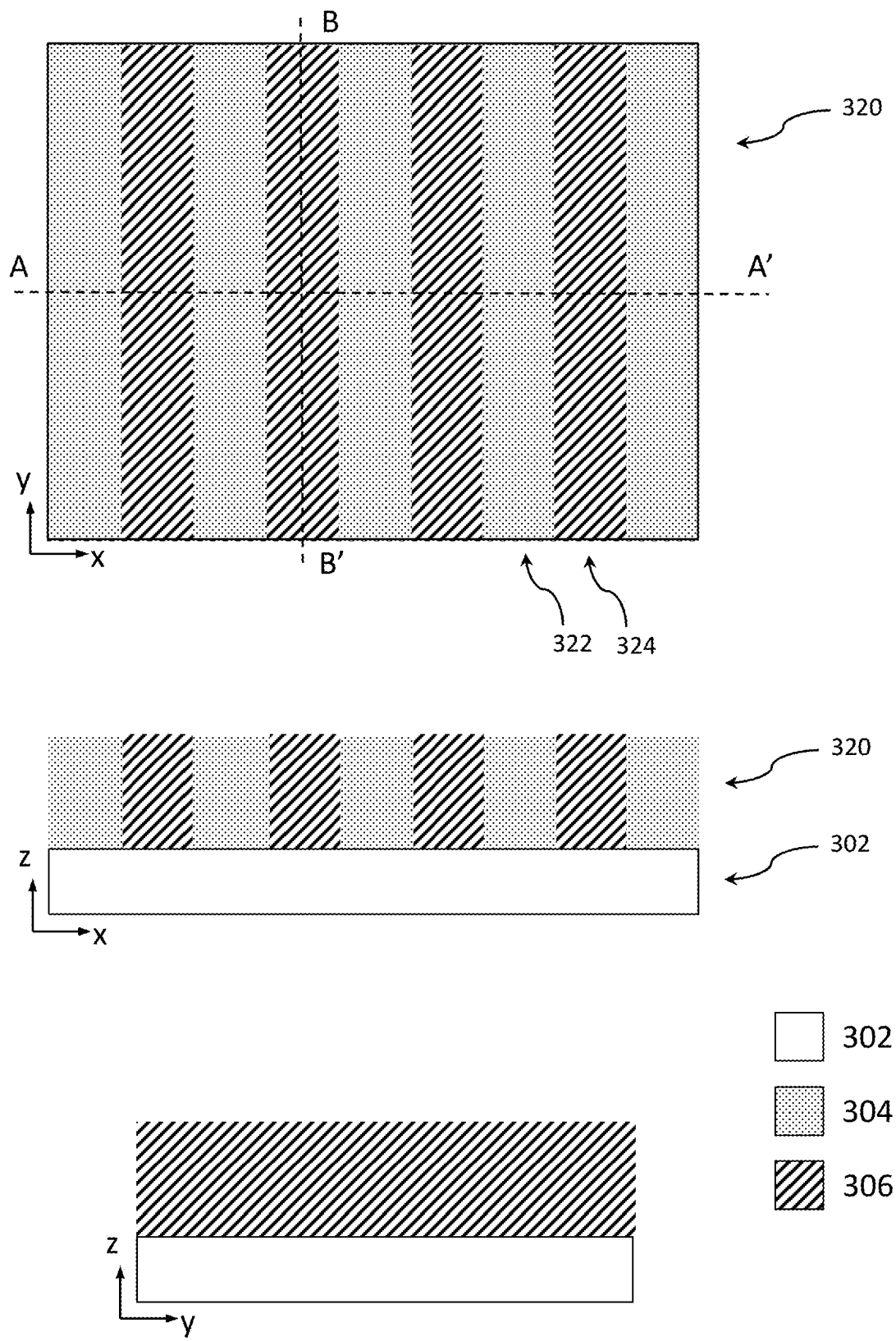
FIGS. 3A-3K illustrate various stages in the process of generating the aligned hexagonal and forming vias in the hexagonal array according to the method of FIG. 2, according to some embodiments of the present disclosure.

FIG. 3A illustrates an example of a grating 320, e.g., a metal grating, over which an array of contacts may be formed. The grating 320 includes a series of conducting portions, e.g., conducting portion 324, separated by insulting portions, e.g., insulating portion 322. The conducting portions are formed of the electrically conductive material 306, and the insulating portions are formed of the insulator 304. The conducting portions and insulating portions are formed over a support structure 302.

In general, implementations of the disclosure may be formed or carried out on a substrate, such as a semiconductor substrate composed of semiconductor material systems including, for example, N-type or P-type materials systems. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. Although a few examples of materials from which the substrate may be formed are described here, any material that may serve as a foundation upon which an IC may be built falls within the spirit and scope of the present disclosure. In various embodiments, the support structure 302 may include any such substrate, possibly with some layers and/or devices, e.g., the grating 320, already formed thereon, providing a suitable surface for forming the metal contacts as described herein.

The insulator 304 may include any insulating medium such as an interlayer dielectric (ILD). The insulator 304 may include any suitable ILD materials such as silicon oxide, carbon-doped silicon oxide, silicon carbide, silicon nitride, aluminum oxide, and/or silicon oxynitride.

The electrically conductive material 306 may include one or more of any suitable electrically conductive materials (conductors). Such materials may include any suitable electrically conductive material, alloy, or a stack of multiple electrically conductive materials. In some embodiments, the electrically conductive material 306 may include one or more metals or metal alloys, with metals such as copper, tungsten, molybdenum, ruthenium, palladium, platinum, cobalt, nickel, hafnium, zirconium, titanium, tantalum, and aluminum. In some embodiments, the electrically conductive material 306 may include one or more electrically conductive alloys, oxides (e.g., conductive metal oxides), carbides (e.g., hafnium carbide, zirconium carbide, titanium carbide, tantalum carbide, and aluminum carbide, tungsten, tungsten carbide), or nitrides (e.g., hafnium nitride, zirconium nitride, titanium nitride, tantalum nitride, and aluminum nitride) of one or more metals. In some embodiments, a metal may be doped, e.g., copper may be doped with aluminum or manganese. In some embodiments, a metal structure may further include a metal liner; a suitable metal liner may include, for example, one or more of tantalum, tantalum nitride, ruthenium, cobalt, ruthenium-cobalt, titanium, or titanium nitride. In many implementations, the electrically conductive material 306 is formed of metal or includes a metal; thus, the grating 320 may be referred to as a metal grating 320.

Figure 3B:
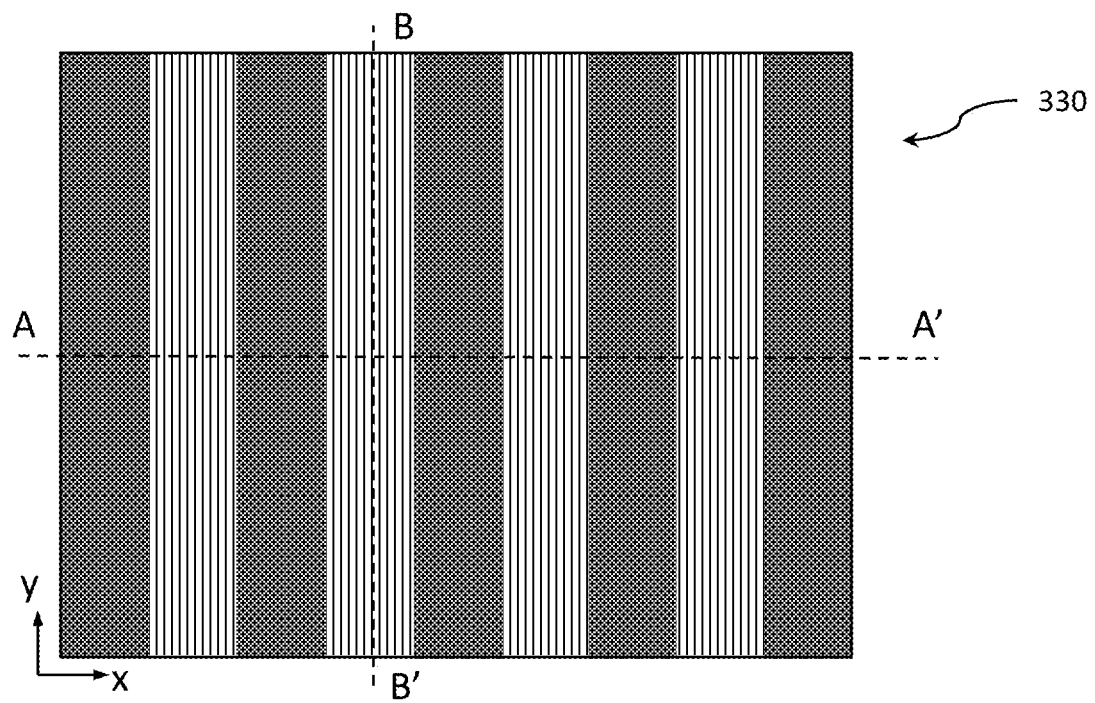
Figure 3B:
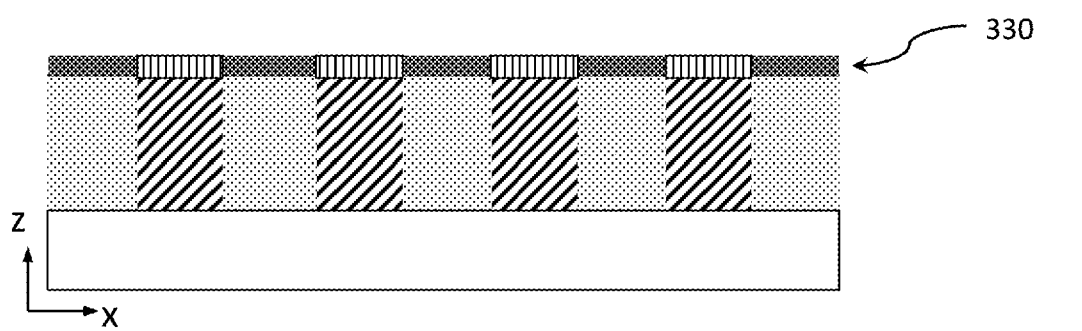
Figure 3B:
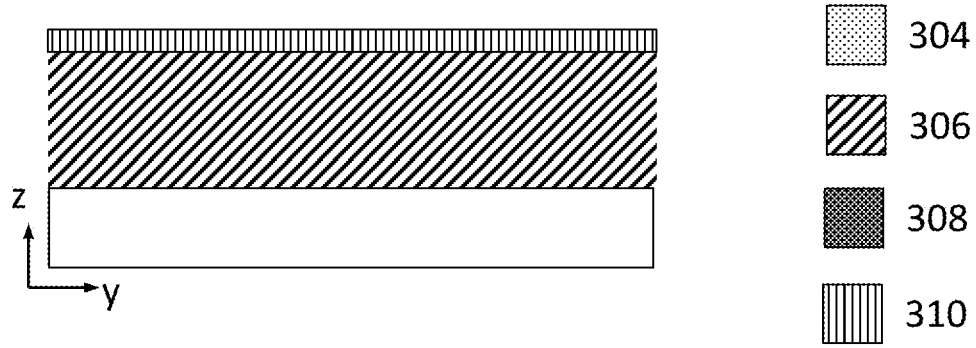

Turning to FIG. 2, the method 200 may begin with depositing 202 a guiding pattern over a grating, e.g., the grating 320 shown in FIG. 3A. FIG. 3B illustrates an example result of depositing a guiding pattern 330 over the grating. As shown in FIG. 3B, the guiding pattern 330 includes a first anchoring material 308 and a second anchoring material 310.

Figure 3C:
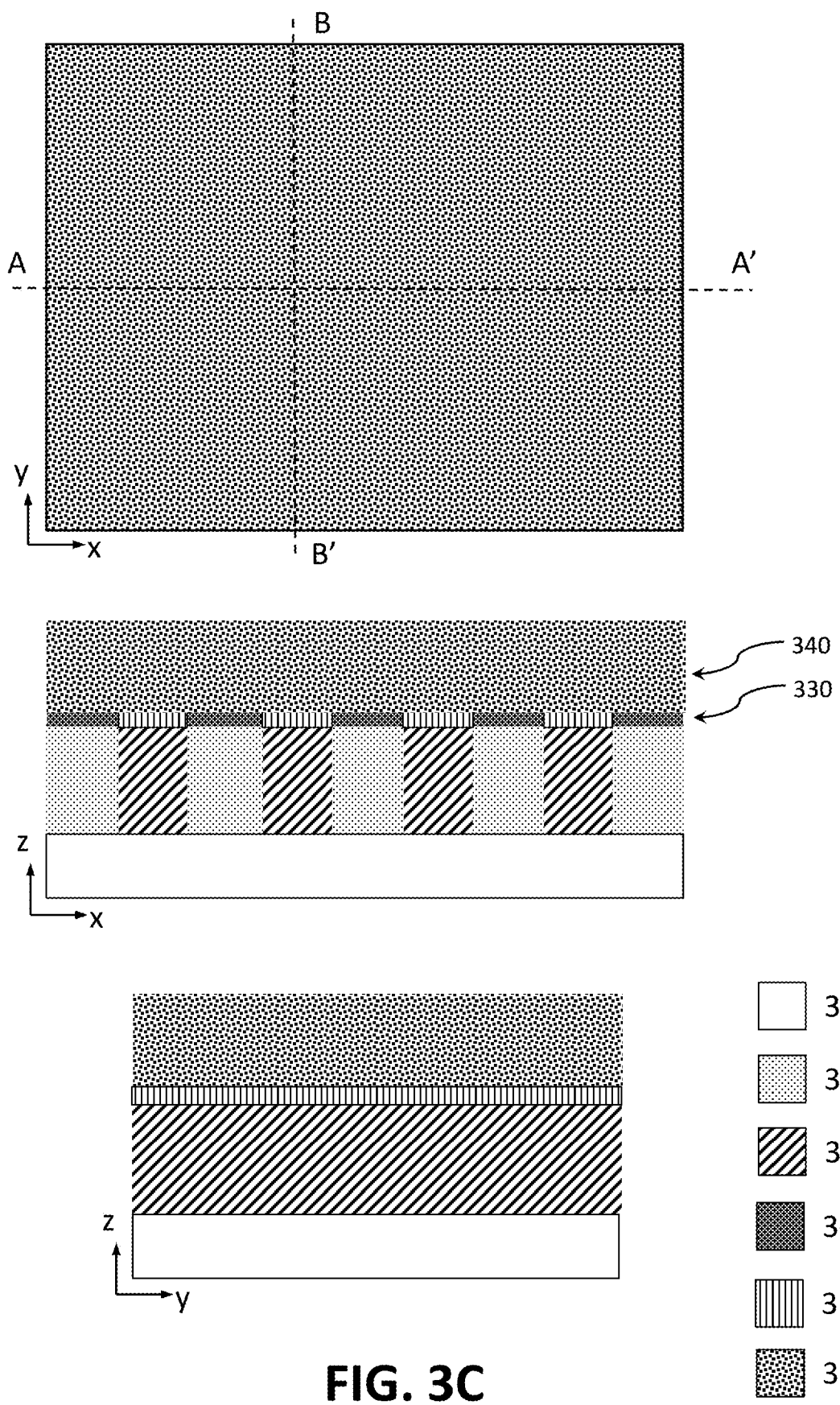
Figure 3D:
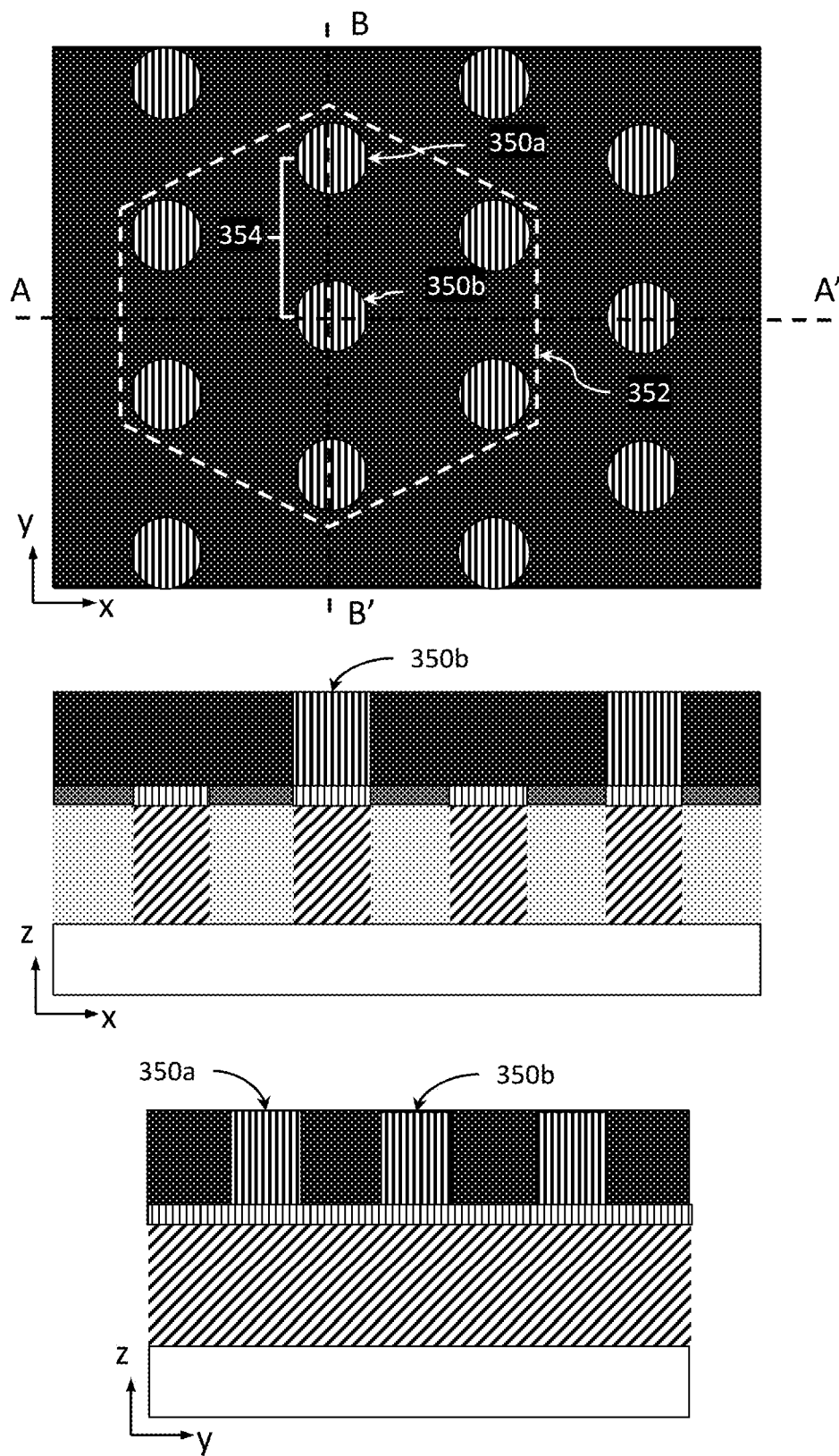

As discussed further below, the diblock copolymer includes two different types of monomers with different chemical properties. The guiding pattern 330 chemically modifies the surface of the grating 320 to impose different affinity to different polymer blocks of the diblock copolymer. This enforces the orientation of a diblock copolymer formed over the guiding pattern 330, as illustrated in FIG. 3D. Each anchoring material 308 and 310 may have a greater interaction tendency (e.g., repulsive or attractive) with one polymer block than with another, e.g., the first anchoring material 308 attracts a first polymer block (e.g., polymer A) or repels a second polymer block (e.g., polymer B), whereas the second anchoring material 310 attracts the polymer block (e.g., polymer B) or repels the first polymer block (e.g., polymer A). Thus, the anchoring materials 308 and 310 tend to influence the self-assembly of the diblock copolymer.

In some embodiments, the guiding pattern 330 may be deposited by applying coatings of the anchoring materials 308 and 310 having a different chemical property (e.g., a hydrophilic/hydrophobic property). In some embodiments, the guiding pattern 330 may be applied by spin coating, spray coating, dipping coating, immersion coating, or otherwise depositing or applying a relatively thin coating of a material that has a chemical property (e.g., a hydrophilicity or hydrophobicity) that corresponds to chemical properties of the different polymer blocks. The chemical properties of the grating 320 may influence the placement of the anchoring materials 308 and 310 over the grating 320. In particular, the first anchoring material 308 may adhere to the insulator 304 (e.g., the insulating portions in the metal grating 320), while being repelled from the electrically conductive material 306. The second anchoring material 310 may adhere to the electrically conductive material 306 (e.g., metal portions in a metal grating 320), while being repelled from the insulator 304. Additionally or alternatively, other types of surface treatments (e.g., oxidizing or de-oxidizing) may be used to modify the surface of the grating 320 to generate the guiding pattern 330.

Figure 4:
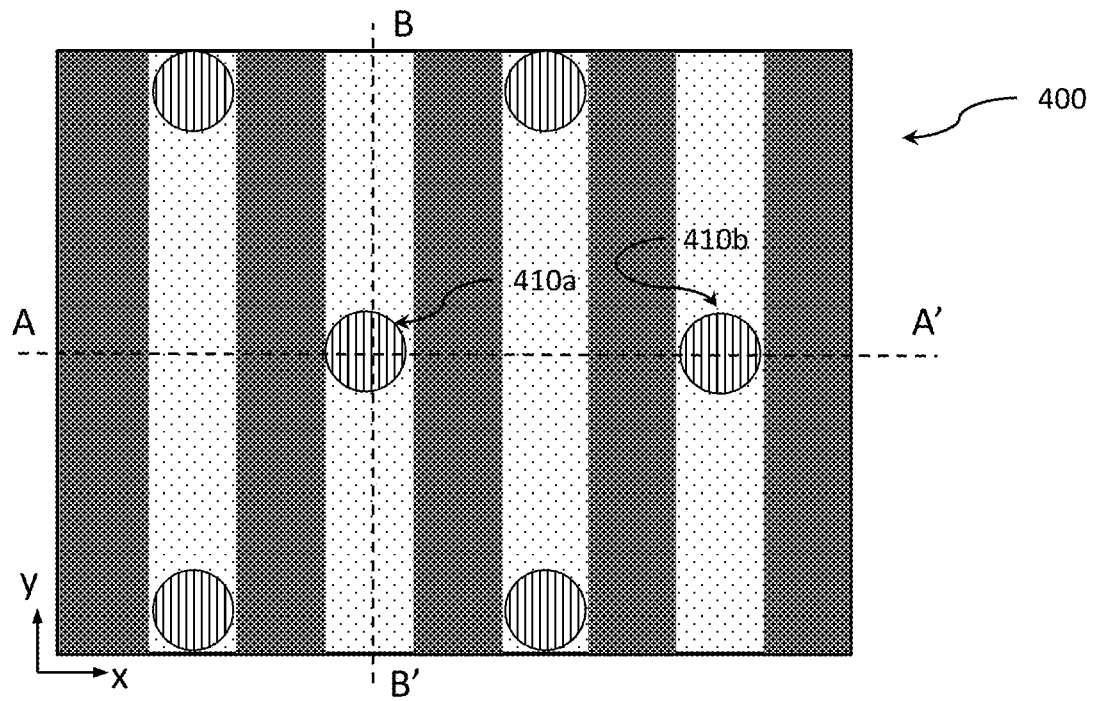
FIG. 4 illustrates a second example guiding pattern for generating an aligned hexagonal array, according to some embodiments of the present disclosure.
Figure 4:
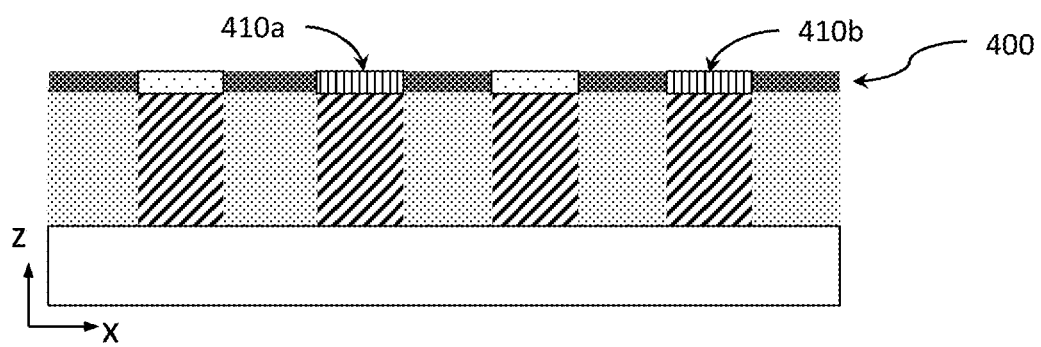
Figure 4:
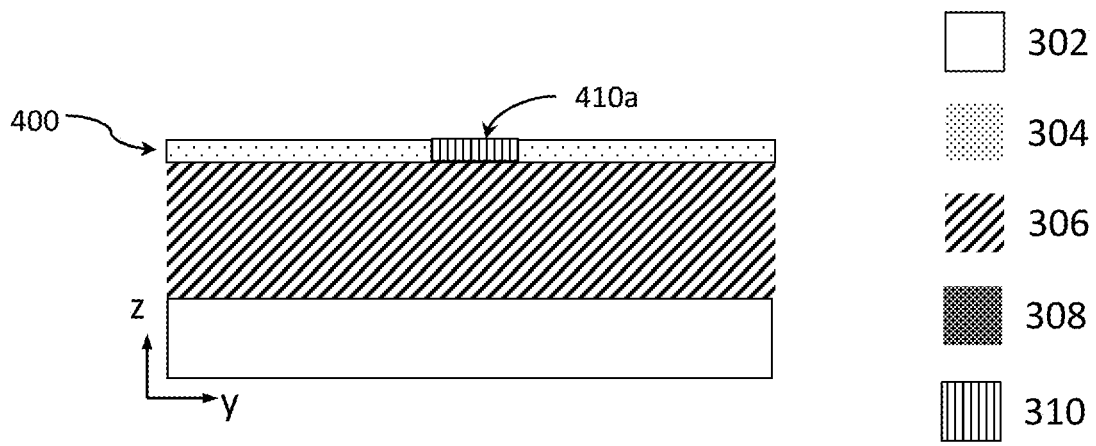

The first anchoring material 308 and the second anchoring material 310 are illustrated as having a striped pattern with alternating stripes of the first anchoring material 308 and the second anchoring material 310, with the stripes' widths and positions following the widths and positions of the conducting portions 324 and insulating portions 322 of the grating 320 below the guiding pattern 330. In other embodiments, the first anchoring material 308 and/or second anchoring material 310 may be applied in different arrangements, e.g., as shown in FIGS. 4 and 5. In other embodiments, only one or the other of the first anchoring material 308 and the second anchoring material 310 may be applied in a striped pattern, and areas between the stripes of the anchoring material are not covered or treated, or a neutral material may be applied.

After the guiding pattern 330 is deposited, the method 200 proceeds with depositing 204 a solution of a diblock copolymer over the guiding pattern 330. FIG. 3C illustrates an example result of depositing a layer 340 of a diblock copolymer 312 over the guiding pattern 330.

The diblock copolymer 312 is a polymeric molecule formed of a chain of covalently bonded monomers. The diblock copolymer 312 may be deposited in a solution comprising the diblock copolymer combined with a liquid solvent, e.g., a glycol ether such as propylene glycol monomethyl ether acetate (PGMEA). The diblock copolymer 312 is formed from two different types of monomers. The different monomers are primarily included within different blocks or contiguous sequences of monomers. For example, a molecule of the diblock copolymer 312 includes a block of first polymer, referred to as, polymer A, and a block of a second polymer, referred to as polymer B. The block of polymer A and the block of polymer B are covalently bonded together. An individual block of polymer A includes predominantly a chain of covalently linked monomer A (e.g., A-A-A-A-A . . . ), whereas the block of polymer B includes predominantly a chain of covalently linked monomer B (e.g., B-B-B-B-B . . . ). The monomers A and B may represent any of the different types of monomers used in block copolymers known in the arts. Examples of the polymer A and polymer B include polyethylene, polystyrene, polyvinylchloride, polytetrafluorethylene, polydimethylsiloxane, some polyesters, some polyurethanes, acrylics, epoxies, P (t-Buytl Acrylate), polyacrylic acid, polyacrylamide, maleic anhydride polymers, polyethylene, polypropylene, polyacrylonitrile, polybutadiene, polyvinyl acetate, polyacetic acid, polybutyl acrylate, polylactic acid, polycaprolactone, poly(ethylene glycol), polyisoprene, poly(m-ethyl methacrylate) (PMMA), and so on. In other embodiments, the polymer A or polymer B may be other polymers. In some embodiments, an individual block may include different types of monomers. For example, the individual block may itself be a copolymer of two or more types of monomers.

The blocks of polymer A and polymer B are of different lengths, so that one block is longer than the other. This results in a diblock copolymer solution with a greater concentration of polymer A to polymer B (or vice versa). For example, the length ratio of polymer A to polymer B may be greater than 1:1, e.g., 6:4, 7:3, 8:2, etc. The mismatched lengths of polymer A and polymer B results in a diblock copolymer solution with a greater concentration of polymer A than polymer B. For example, the diblock copolymer 312 may have at least a 6:4 ratio of polymer A to polymer B, or at least a 7:3 ratio of polymer A to polymer B.

As noted above, the block of polymer A and the block of polymer B have different chemical properties. As one example, one of the blocks may be relatively more hydrophobic (e.g., water disliking) and the other may be relatively more hydrophilic (water liking). As another example, one of the blocks may be relatively more similar to oil and the other block may be relatively more similar to water. Such differences in chemical properties between the different blocks of polymers, whether a hydrophilic-hydrophobic difference or otherwise, may cause the diblock copolymer 312 to self-assemble. For example, the self-assembly may be based on microphase separation of the polymer blocks. Conceptually, this may be similar to the phase separation of oil and water which are generally immiscible. Similarly, differences in hydrophilicity between the polymer blocks (e.g., one block is relatively hydrophobic and the other block is relatively hydrophilic), may cause a roughly analogous microphase separation where the different polymer blocks try to separate from each other due to chemical dislike for the other.

Returning to FIG. 2, in some embodiments, an annealing process 206 may be performed after the diblock copolymer 312 is deposited in order to initiate, accelerate, or otherwise promote the self-assembly. In some embodiments, the annealing treatment may be a solvent annealing treatment that happens in an atmosphere of solvent vapor. The solvent vapor may be a vapor of acetone, tetrahydrofuran, or other types of organic solvent. The solvent annealing treatment can promote diffusion and self-assembly kinetics of larger polymers, such as diblock copolymers. In other embodiments, the annealing treatment may include a treatment that is operable to increase a temperature of the diblock copolymer. Such a treatment may include heating the IC device (e.g., in an oven or under a thermal lamp), applying infrared radiation to the diblock copolymer, or otherwise applying heat to or increasing the temperature of the layer 340 of the diblock copolymer 312. The heating may help to provide energy to the molecules of the diblock copolymer 312 to make them more mobile and/or flexible, which can increase the rate of the microphase separation. The annealing is performed at a temperature that is high enough to increase the rate of microphase separation but low enough to avoid damaging the diblock copolymer or other components of the IC device. In some embodiments, the annealing temperature is in a range from 50° C. to 300° C.

FIG. 3D illustrates an example result of the self-assembly of the diblock copolymer 312, e.g., after annealing the diblock copolymer 312. In general, because the blocks of polymer A and polymer B are covalently bonded to one another in each diblock copolymer molecule, the blocks of polymer A and polymer B cannot be completely separated on a macroscopic scale. Rather, polymer blocks of a given type may tend to segregate or conglomerate with polymer blocks of the same type of other molecules. Self-assembly of the diblock copolymer 312 into regions of polymer A and polymer B, whether based on hydrophobic-hydrophilic differences or otherwise, is used to form extremely small periodic structures (e.g., precisely spaced nanoscale structures), such as the hexagonal pattern shown in FIG. 3D.

More specifically, as shown in FIG. 3D, the regions of polymer B 316 form cylindrical structures 350, e.g., cylindrical structures 350a and 350b (referred to generally as "cylindrical structures 350" or simply "cylinders 350"). The regions of polymer B 316 are formed within a region or layer of polymer A 314, i.e., polymer A 314 surrounds the cylinders 350 of polymer B 316. In this example, the cylinders 350 are arranged in a hexagonal pattern, e.g., the seven cylinders 350 surrounded by the outline 352 are arranged in a hexagon, with one central cylinder 350b surrounded by six evenly-distributed cylinders 350, including cylinder 350a. The guiding pattern 330 causes the cylinders 350, which are formed from polymer B 316, to be precisely aligned over the second anchoring material 310, which is aligned over the electrically conductive material 306 (e.g., metal portions in a metal grating 320). Thus, the cylinders 350 are aligned over the metal portion of the metal grating 320.

Each of the cylinders 350 may have a diameter between, e.g., 5 and 30 nanometers. The diameter of the cylinders 350 may depend at least in part on the length of the diblock copolymer 312, and in particular, the length of the polymer B portion of the diblock copolymer 312. The cylinders 350 may be arranged with a pitch between, e.g., 10 nanometers and 60 nanometers. The pitch refers to the distance between the centers of adjacent cylinders, e.g., an example pitch 354 between the cylinders 350a and 350b is illustrated in FIG. 3D. The pitch of the array is based on the pitch of the grating 320. Furthermore, the length of the diblock copolymer 312, including the length of the polymer A portion of the diblock copolymer 312, and/or the ratio of polymer A to polymer B in the diblock copolymer 312 may be selected to obtain a pattern of a particular pitch.

The array may exhibit a high degree of regularity, e.g., a higher degree of regularity compared to the unguided array shown in FIG. 1. For example, in a hexagonal array formed over a guiding pattern such as the guiding pattern 330, pitches between adjacent cylinders 350 may be within, e.g., ±5%, ±10%, or ±20% of a target pitch. For example, if a target pitch is 30 nanometers and the pitches are within ±10% of the target pitch, all or most (e.g., at least 90% or at least 95%) of the adjacent cylinders 350 may have a pitch between 27 and 33 nanometers. Furthermore, the cylinders 350 may have a high degree of regularity in their diameters, e.g., across a hexagonal array formed over a guiding pattern, all or most (e.g., at least 90% or at least 95%) of cylinder diameters may be within, e.g., ±5%, ±10%, or ±20% of a target diameter.

The array of cylindrical structures 350 can be used to form via openings over the metal portions of the metal grating 320. Returning to FIG. 2, the method 200 proceeds with converting 208 polymer A 314 and polymer B 316 to two different hard mask materials 390 and 392. For example, polymer A 314 is selectively etched, and a first hard mask material is deposited in place of polymer A 314. After polymer A 314 is converted to a hard mask, polymer B 316 may be selectively etched, and a second hard mask material is deposited in place of polymer B 316. During this process, the materials in the guiding pattern 330 under polymer A 314 and polymer B 316 may also be etched. In some embodiments, rather than etching one or both of the polymers 314 and 316, a polymer may be converted to a metal oxide, e.g., by sequential infiltration synthesis, vapor phase infiltration, or liquid phase infiltration.

Figure 3E:
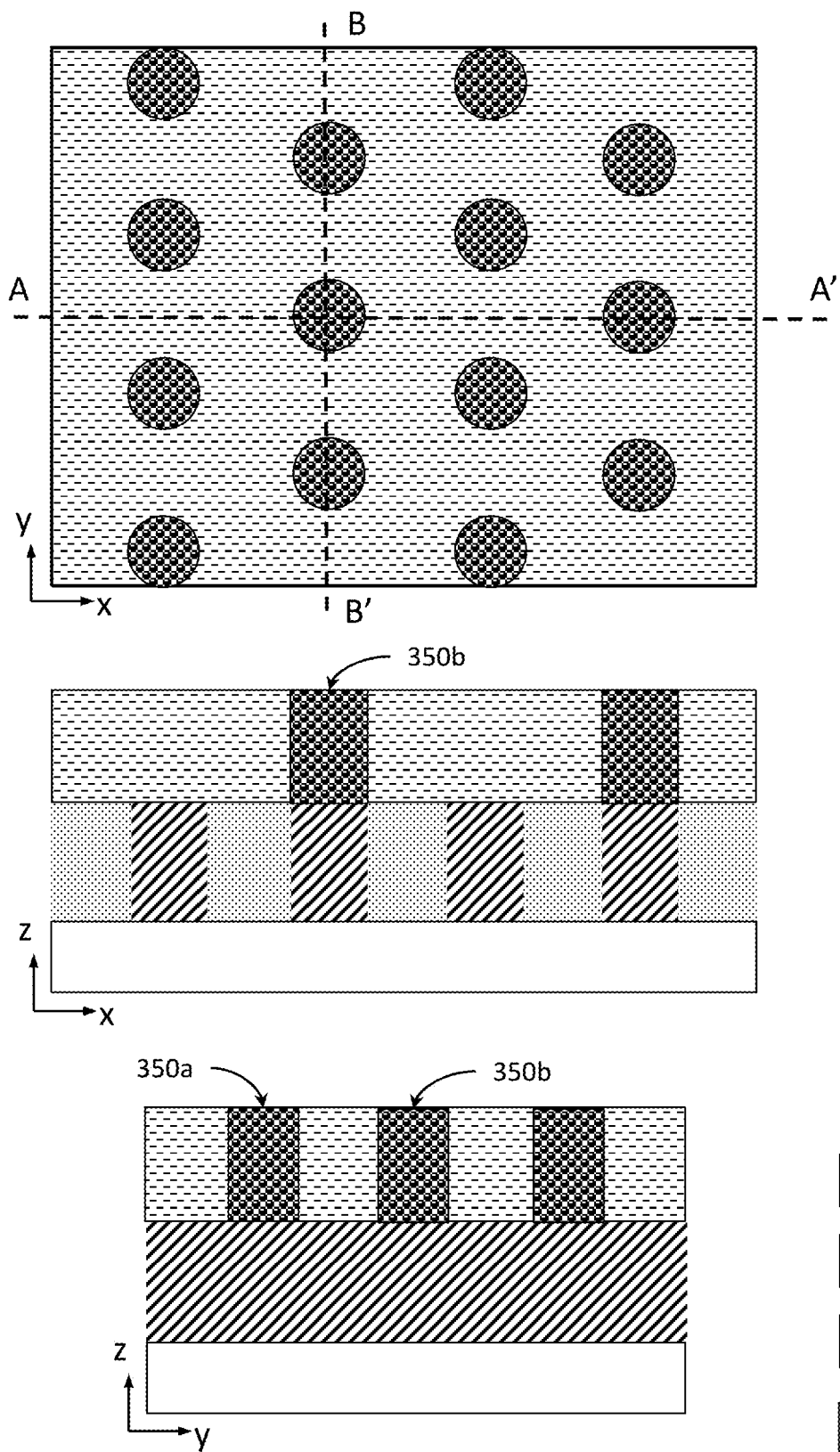
Figure 3F:
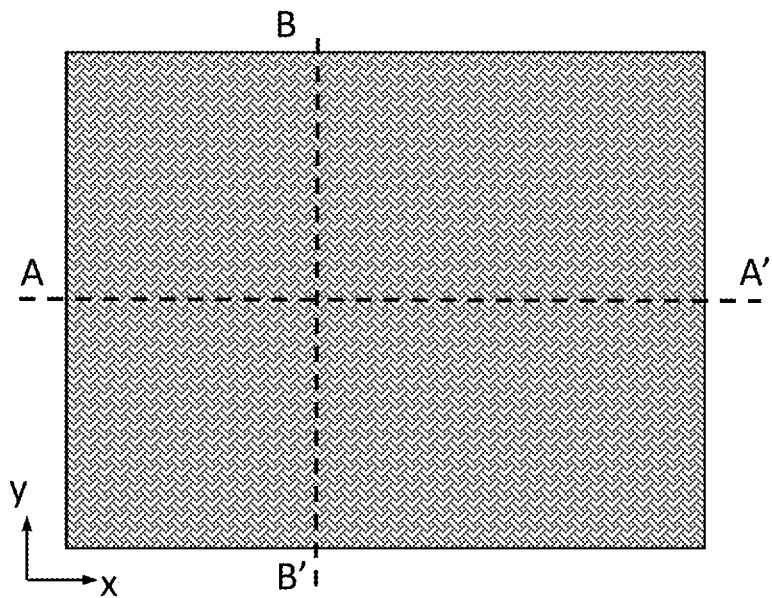
Figure 3F:
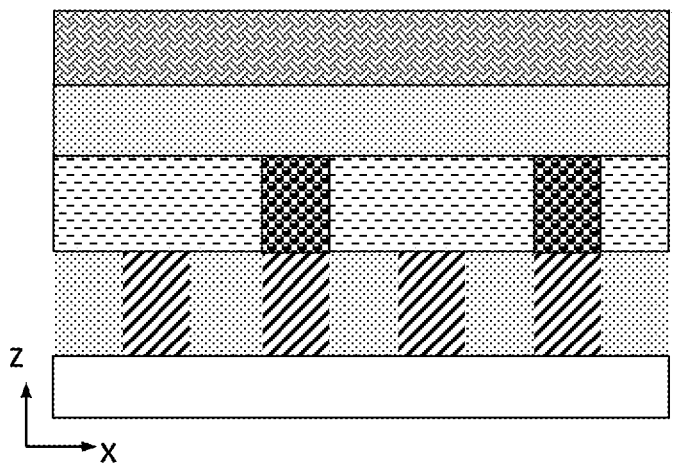
Figure 3F:
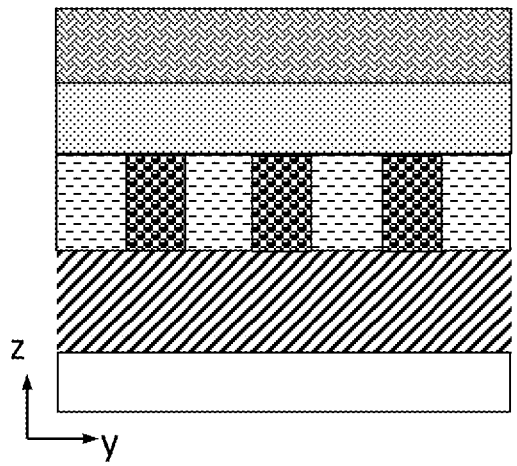

FIG. 3E illustrates an example result of converting polymer A 314 to a first hard mask material 390 (also referred to as hard mask A 390) and converting polymer B 316 to a second hard mask material 392 (also referred to as hard mask B 392). The layer of the hard mask materials 390 and 392 may be referred to as a hard mask layer. The hard mask materials 390 and 392 replicate the structure of polymer A 314 and polymer B 316, e.g., the cylindrical structures 350 are present in the hard mask layer, with the cylindrical structures 350 now comprised of the hard mask B 392 and surrounded by hard mask A 390. The hard mask materials 390 and 392 may be different materials with strong etch selectivity, so that one or both of the hard masks themselves may be selectively etched (e.g., a cylinder 350 of the hard mask B 392 may be etched without etching hard mask A 390 surrounding the cylinder 350). This way, the cylinders 350 may be selectively etched to form holes, and vias may be deposited in the holes and coupled to metal 306 in the grating 320.

Figure 3G:
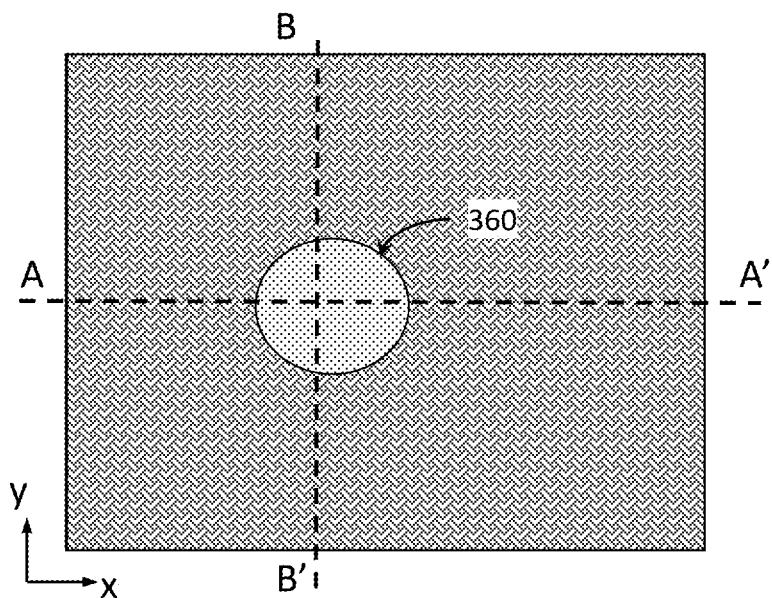
Figure 3G:
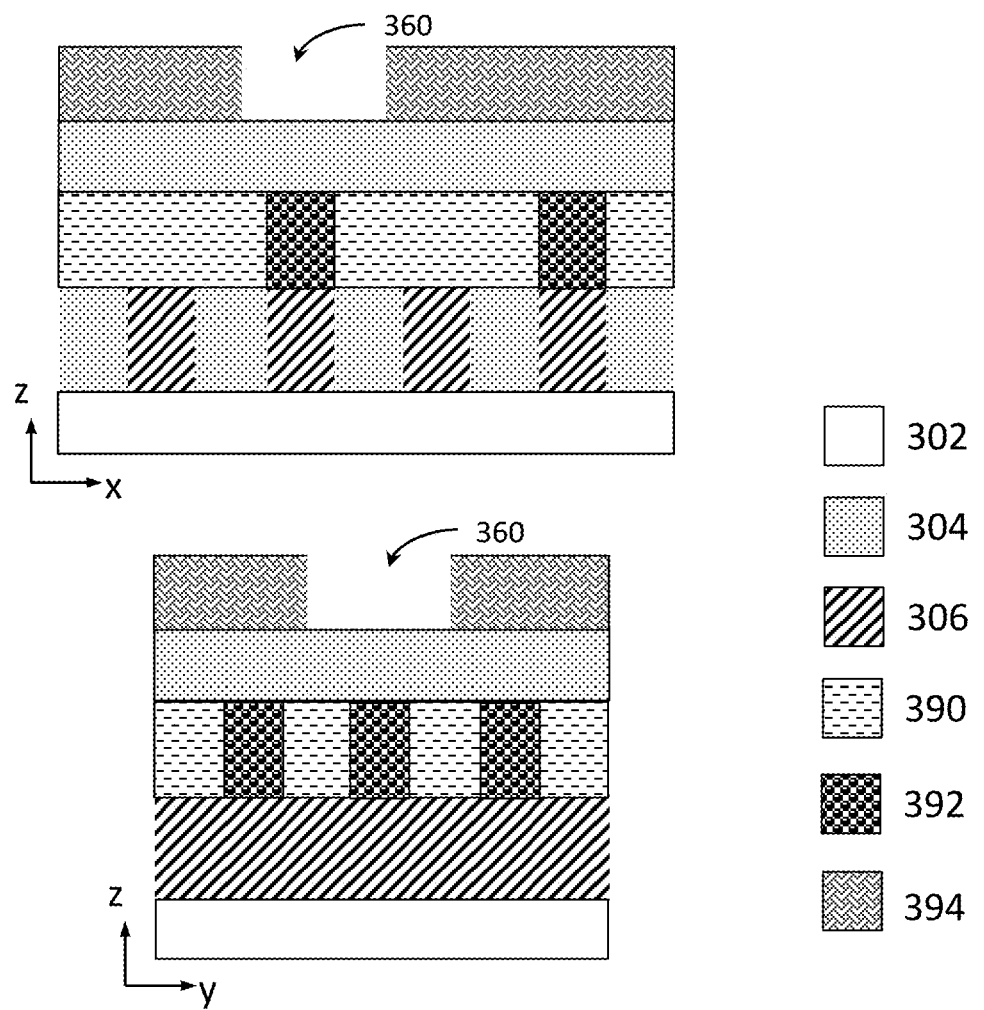

The method 200 may proceed with depositing 210 a layer of insulator and a layer of a resist material over the hard mask layer. FIG. 3G illustrates an example result of depositing an insulator layer and a resist layer over the hard mask layer. In this example, the same insulator material 304 included in the grating 320 is deposited over the hard mask layer. In other embodiments, a different insulator material may be used, e.g., any of the insulators mentioned above with respect to the insulator 304. A resist 394 is deposited over the insulator 304. The resist 394 may be, for example, a photoresist that is spin coated over the insulator 304.

Figure 3H:
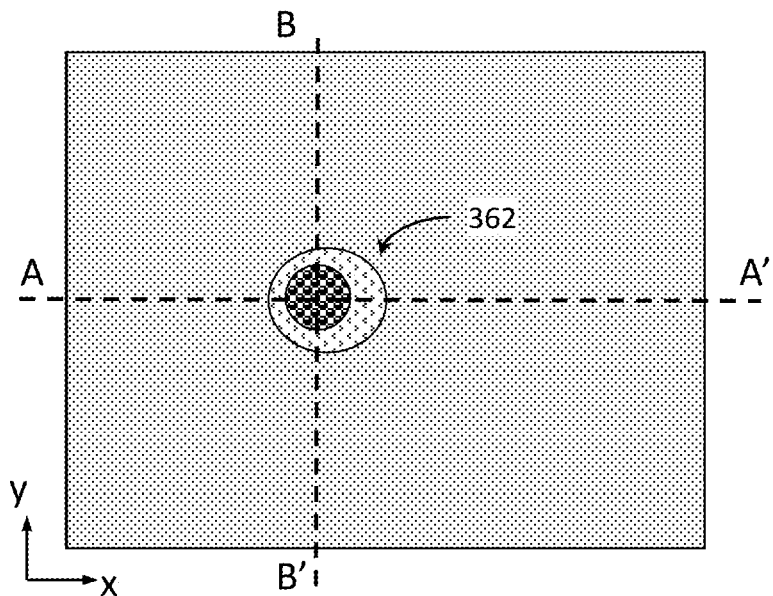
Figure 3H:
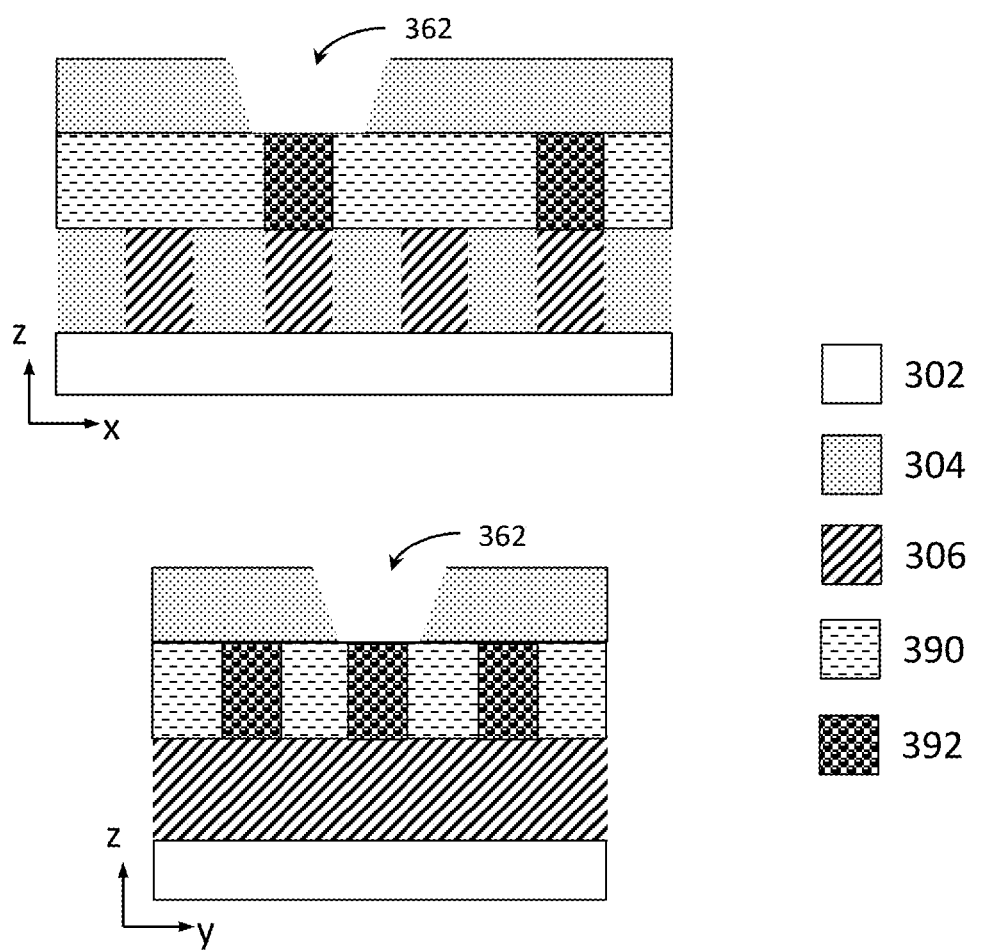

The method 200 proceeds with patterning 212 a portion of the resist over one of the cylinders 350. FIG. 3H illustrates an example of patterning the resist 394. For example, if the resist 394 is a photoresist, the photoresist may be exposed to patterned actinic radiation through a patterned mask, and then the exposed layer may be developed to form an opening in the photoresist. An example opening 360 is illustrated in FIG. 3H. As illustrated in FIG. 3H, the surface area in the x-y plane of the opening 360 may be somewhat larger than the surface area of the underlying cylinder 350 (in this example, cylinder 350b), and the opening 360 may not be centered directly over the cylinder 350. The structure of the hard mask layer and the etch selectivity between hard mask A 390 and hard mask B 392 provides a tolerance in the lithographic process performed over the hard mask layer, reducing the precision required for the lithographic process. While one opening 360 over one example cylinder 350b is illustrated in FIG. 3H, openings over any number of the cylinders 350 may be formed during the patterning process 212.

Figure 3I:
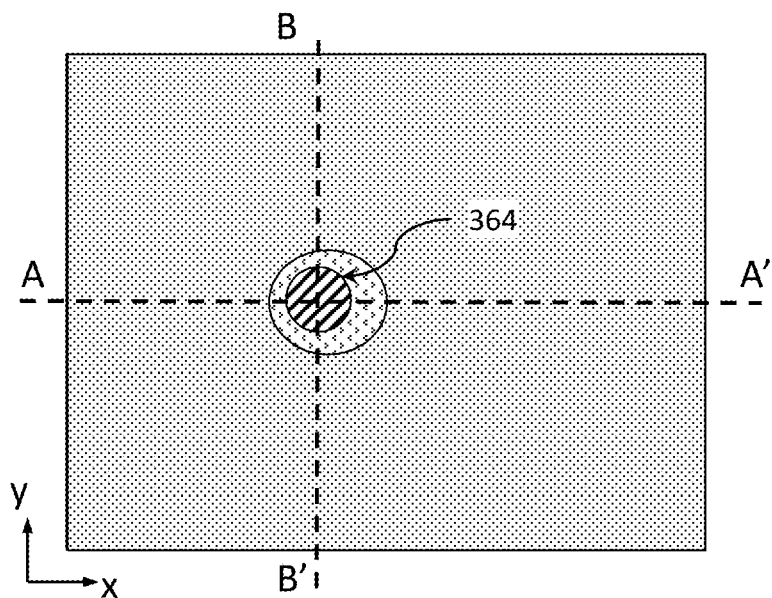
Figure 3I:
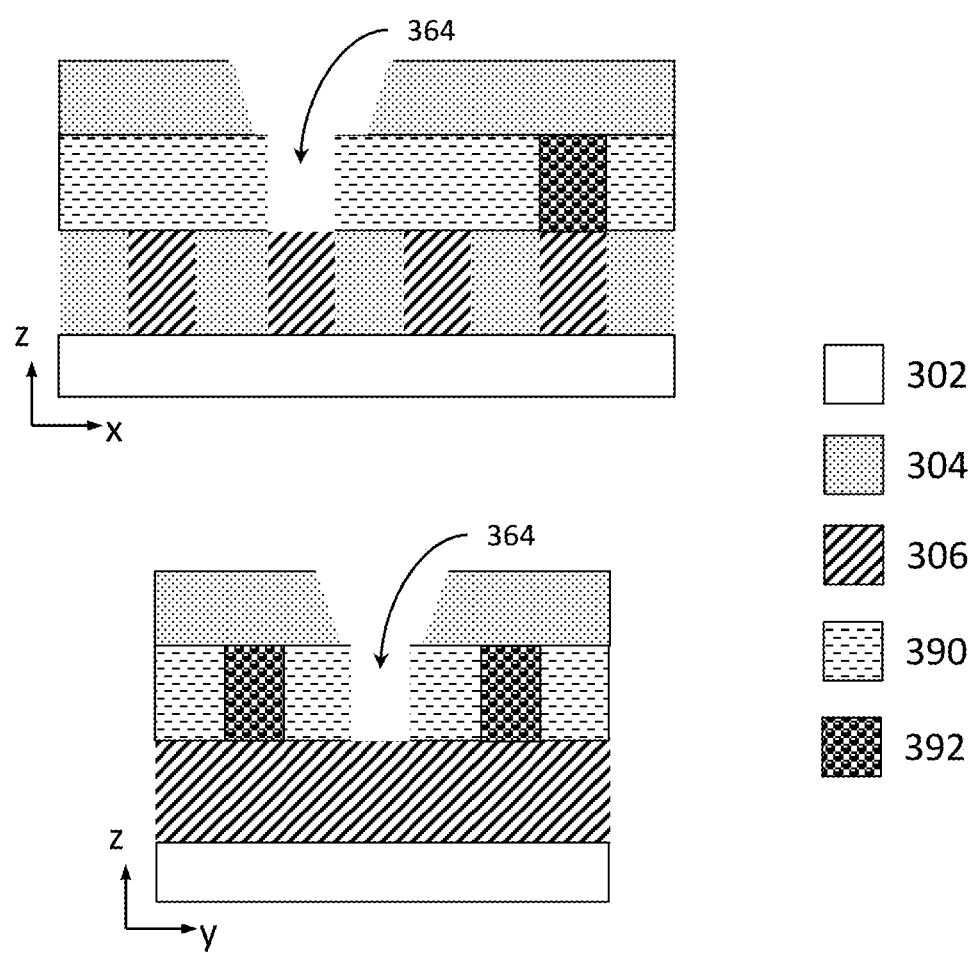

The method 200 proceeds with etching 214 a portion of the insulator over the cylinder. FIG. 3I illustrates an example of etching a portion of the insulator 304 to form an opening 362 over the cylinder 350b. The opening 360 in resist 394 acts as an etch mask for etching the opening 362 in the insulator 304. After the opening 362 has been etched (and any similar openings over other cylinders 350), the remaining resist 394 may be removed, as illustrated in FIG. 3I.

Figure 3J:
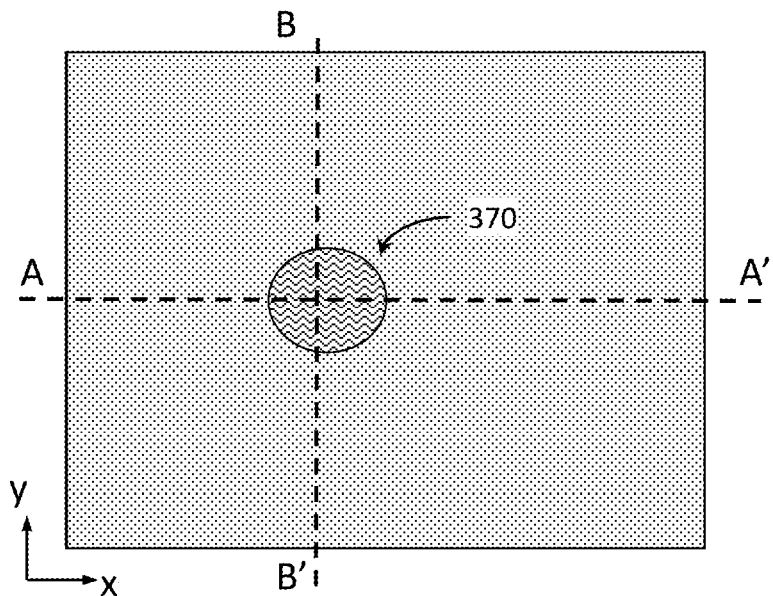
Figure 3J:
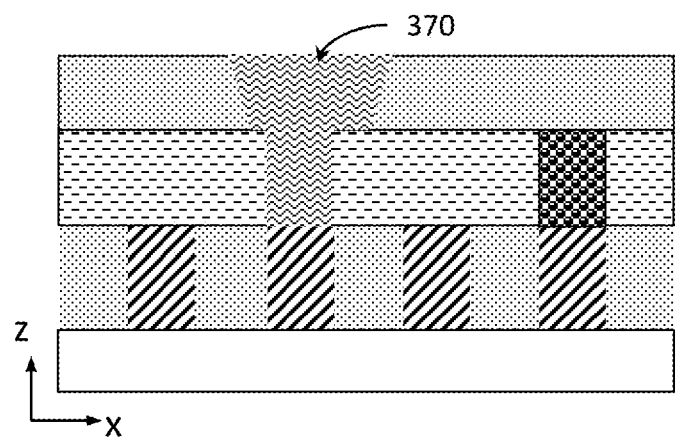
Figure 3J:
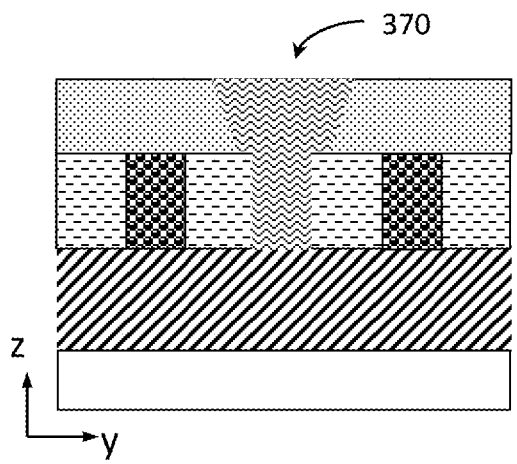

The method 200 proceeds with etching 216 a cylinder under the opening formed in the insulator. The etching 216 may be performed using an isotropic chemically selective etch material. FIG. 3J illustrates an example of etching the cylinder 350b under the opening 362 to form an opening 364. Here, the opening 362 in the insulator 304 acts as an etch mask for etching the opening 364. In addition, the etch selectivity between hard mask A 390 and hard mask B 392 prevents a portion of hard mask A 390 that is exposed by the opening 362 from being etched. In this example, the opening 364 is an opening for forming a via connecting to the metal 306 below the opening 364.

The method 200 proceeds with depositing 218 a via in the opening in the hard mask layer. FIG. 3J illustrates an example result of depositing a via 370 in the opening 364. The via 370 extends through the hard mask layer and the layer of insulator 304 over the hard mask layer. The via 370 may be formed of any suitable conductive material 396, e.g., any of the materials described with respect to the electrically conductive material 306. The via 370 may include the same material or materials as the electrically conductive material 306 used in the metal grating 320, or the via 370 may be formed from a different material or materials. In some embodiments, the via 370 may be separated from the electrically conductive material 306 by a barrier layer, e.g., the barrier layers described above with respect to the electrically conductive material 306. The via 370 may be deposited using a conformal deposition method (e.g., ALD (atomic layer deposition) or CVD (chemical vapor deposition)), or a non-conformal deposition method (e.g., sputtering). The via 370 is coupled to a metal portion of the metal grating 320.

While one example via 370 is illustrated in FIG. 3J, multiple or many similar vias 370 may be formed through the processes 212-218, e.g., by including additional areas over additional cylinders in the patterned mask used to pattern the resist in the lithographic patterning process 212. Thus, the processes 212-218 may be used to form an array of vias 370, with each via 370 at the position of one of the cylinders 350. The vias 370 have shapes and patterns corresponding to the cylinders 350 described with respect to FIG. 3D. In particular, each of the vias 370 may have a diameter between, e.g., 5 and 30 nanometers. As noted above, the diameter of the vias 370 may depend at least in part on the length of the diblock copolymer 312, and in particular, the length of the polymer B portion of the diblock copolymer 312. The vias 370 may be arranged with a pitch between, e.g., 10 nanometers and 60 nanometers. As noted above, the pitch of the array is based on the pitch of the grating 320, and the length of the diblock copolymer 312, including the length of the polymer A portion of the diblock copolymer 312, and/or the ratio of polymer A to polymer B in the diblock copolymer 312 may be selected to obtain a via pattern of a particular pitch.

The via array may exhibit a high degree of regularity. For example, in a hexagonal array of vias formed using a guiding pattern such as the guiding pattern 330, pitches between adjacent vias 370 may be within, e.g., ±5%, ±10%, or ±20% of a target pitch. For example, if a target pitch is 30 nanometers and the pitches are within ±10% of the target pitch, all or most (e.g., at least 90% or at least 95%) of the adjacent vias 370 may have a pitch between 27 and 33 nanometers. Furthermore, the vias 370 may have a high degree of regularity in their diameters, e.g., across a hexagonal array formed over a guiding pattern, all or most (e.g., at least 90% or at least 95%) of the via diameters may be within, e.g., ±5%, ±10%, or ±20% of a target diameter.

In some embodiments, an IC design may not require vias 370 to be formed within all of the cylinders 350 of the array, and instead, some subset of the cylinders 350 may be filled with insulating plugs instead of vias 370. For example, if a subset of the cylinders 350 are not replaced with the conductive material 396 but left as hard mask B 392, the hard mask B 392 may act as an insulating plug. In some embodiments, an IC design may have a plug extend below the cylinder 350 and into the metal grating 320.

Figure 3K:
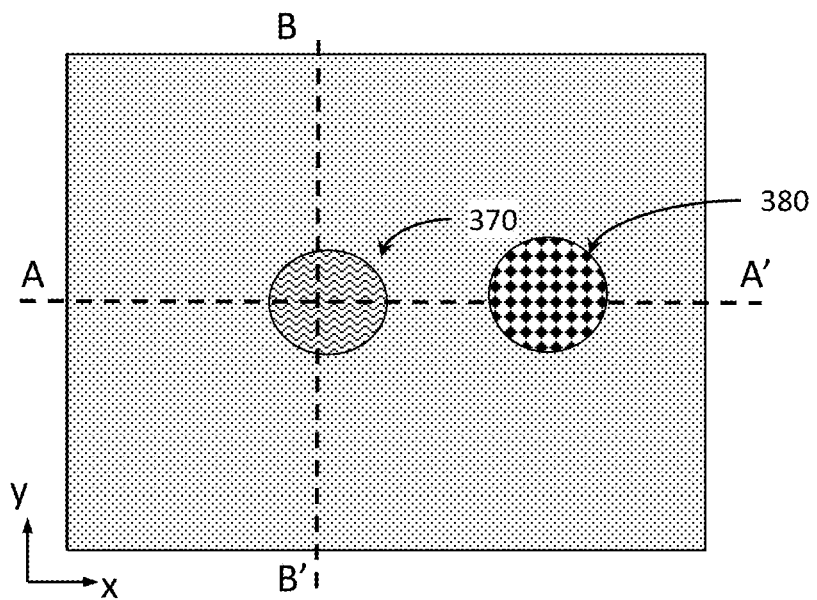
Figure 3K:
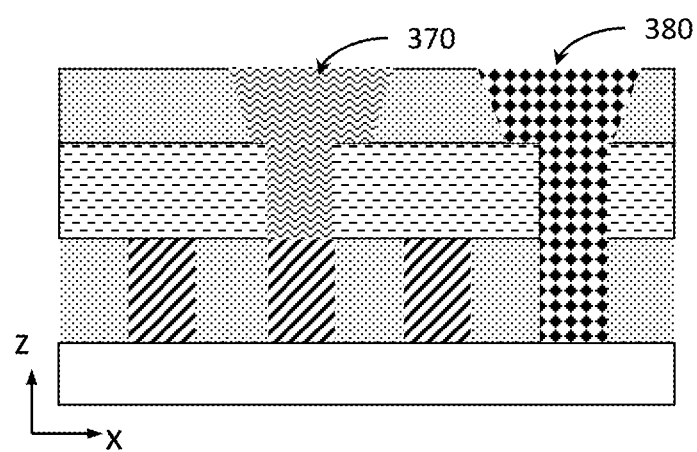
Figure 3K:
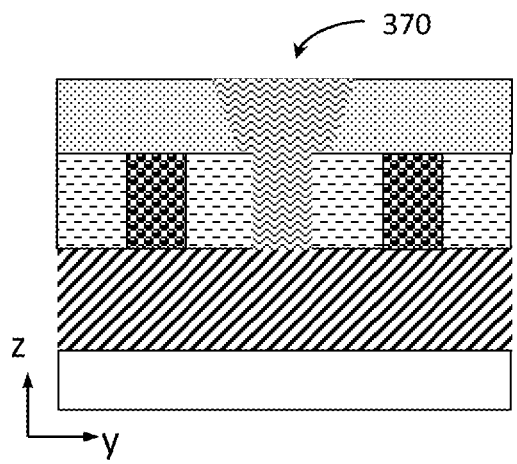

The process 200 may proceed with forming 220 a plug that extends into the metal grating 320. FIG. 2K illustrates an example plug 380 that may be formed at the location of cylinder 350c. To form a plug at a particular cylinder, the hard mask B 392 may be removed using a method similar to processes 210-216, discussed above. After the hard mask B 392 is etched, a portion of the metal 306 exposed by the hard mask layer is etched, which exposes a portion of the support structure 302, or other layer below the metal grating 320. This opening is filled in with an insulator material 398. The insulator material 398 may be a different material from hard maskA 392. For example, the insulator material 398 may include, for example, carbon-doped silicon oxides, silicon nitride, silicon carbide, undoped oxides, and any combination or mixture of silicon carbide, silicon oxide, and silicon nitride. While one insulator plug 380 is illustrated in FIG. 3K, it should be understood that any number of the cylinders 350 may be removed and filled by the insulator material 398 instead of the vias 370 to form any number of insulator plugs 380. In other embodiments, the process 220 of forming plugs 380 may be performed prior to the process 210-218 of forming the vias 370.

Alternate Guiding Patterns for Generating an Aligned Array

In the guiding pattern 330 shown in FIG. 3, the first anchoring material 308 and the second anchoring material 310 have a striped pattern with alternating stripes of the first anchoring material 308 and the second anchoring material 310, with the stripes' widths and positions following the metal and insulating portions of the grating 320 below the guiding pattern 330. While this guiding pattern may result in cylinders 350 and resulting vias 370 that are well-aligned over the metal portions of the metal grating (i.e., in the x-direction in the coordinate system shown in FIG. 3), in some cases, the cylinders 350 and resulting vias 370 that may be less well-aligned along the metal portions of the metal grating 320 (i.e., in the y-direction in the coordinate system shown in FIG. 3). For example, while FIG. 3D depicts the structures 350b and 350c as being well-aligned in the y-direction, in some cases, these vias may be less well-aligned, e.g., the structure 350c may be offset in the y-direction relative to the structure 350b. FIGS. 4 and 5 illustrate two example guiding patterns that may result in improved structure alignment and subsequent improved via alignment, particularly in a direction parallel to the metal portions of the metal grating.

FIG. 4 illustrates an example guiding pattern 400 for generating an aligned hexagonal array, according to some embodiments of the present disclosure. The guiding pattern 400 includes the first anchoring material 308 and the second anchoring material 310. The first anchoring material 308 is arranged in stripes over the insulator 304 portions of the grating, similar to the arrangement of the first anchoring material 308 in FIG. 3B. The second anchoring material 310 is arranged in guiding dots 410, e.g., guiding dots 410a and 410b labelled in FIG. 4. The guiding dots 410 are formed over portions of the electrically conductive material 306, e.g., the metal portions of a metal grating. The remainder of the insulator 304 not covered by the guiding dots 410 may be covered by a neutral material 402. The neutral material 402 may be chemically neutral, or at least relatively more neutral, to different the polymer blocks of the diblock copolymer 312 than the first anchoring material 308 and the second anchoring material 310.

The guiding dots 410 correspond to certain ones of the cylinders 350 shown in FIG. 3D. The guiding pattern 400 in combination with a diblock copolymer, e.g., the diblock copolymer 312 shown in FIG. 3C, may result in the hexagonal array of cylinders 350 shown in FIG. 3D. In this example, there are fewer guiding dots 410 than cylinders 350, i.e., the guiding dots 410 are less dense than the hexagonal array formed from the guiding pattern 400. The guiding dots 410 may encourage the placement of some subset of the cylinders 350 in the hexagonal array, and the properties of the diblock copolymer 312 and the overall arrangement of the guiding pattern 400, including the first anchoring material 308, encourages the formation of the denser hexagonal array shown in FIG. 3D. In other embodiments, a guiding dot may be deposited at each expected position of a cylinder 350.

The guiding dots 410 may be deposited using a resist process. For example, in one embodiment, the striped portion of the guiding pattern 400 is first formed (e.g., by depositing the first anchoring material 308 and the neutral material 402 in alternating stripes over the insulator 304 and the electrically conductive material 306, respectively). Next, a resist is deposited over the striped pattern. The resist is patterned based on the locations for the guiding dots 410, e.g., using EUV patterning. The resist is etched to expose the regions in which the guiding dots 410 will be placed. The second anchoring material 310 is deposited in the exposed regions to form the guiding dots 410, and the remaining resist is removed.

In a second example embodiment, a layer of the second anchoring material 310 is deposited over the metal grating. A resist is deposited over the second anchoring material 310 and patterned, e.g., using EUV patterning, and a portion of the resist is etched. In this example, the etched portion corresponds to regions outside of the guiding dots 410, so that the resist is left over the guiding dots 410. The exposed portion of the second anchoring material 310 is removed, and the neutral material 402 and first anchoring material 308 are then deposited over the insulator 304 and exposed portions of the electrically conductive material 306. The remaining resist over the guiding dots 410 is also removed, either before or after the neutral material 402 and the first anchoring material 308 are deposited.

FIG. 5 illustrates another example guiding pattern 500 for generating an aligned hexagonal array, according to some embodiments of the present disclosure. In this example, diagonal stripes, e.g., stripes 510*a* and 510*b*, are formed from the first anchoring material 308. The diagonal stripes 510 may be deposited using an EUV resist process, e.g., either of the resist processes described with respect to the guiding dots 410 of FIG. 4. In areas where the guiding stripes 510 are not formed, the first anchoring material 308 and second anchoring material 310 are deposited in stripes aligned vertically in the y-direction in the orientation shown in FIG. 5; as described with respect to FIG. 3, the vertical stripes of the first and second anchoring materials 308 and 310 may mimic an underlying metal grating 320.

The diagonal stripes 510 encourage placement of the cylinders of polymer B so that they are properly aligned in the y-direction. Outlines showing the expected locations of cylinders 550 of polymer B are illustrated in FIG. 5. The cylinders 550, which form over the second anchoring material 310, do not form over the diagonal stripes 510. For example, the cylinders 550*a* and 550*b* labelled in FIG. 5 are formed between the two diagonal lines 510*a* and 510*b*.

While the example arrays illustrated herein have a hexagonal pattern, in other embodiments, in other embodiments, a guiding pattern may encourage cylinders to form in a different pattern. For example, alternate guiding patterns may produce an array of cylinders in a square pattern (with cylinders placed at the corners of squares, where the corners are aligned over an underlying metal layer), or an array of cylinders in a rectangular pattern (with cylinders placed at the corners of the rectangles, where the corners are aligned over an underlying metal layer).

Generating an Aligned Hexagonal Array Over a Grating-Replicating Layer

In the example process described with respect to FIGS. 2 and 3, the array is formed over a guiding pattern 330, which is formed directly over the metal grating 320. In an alternate embodiment, a first DSA process may be performed to generate a first layer that replicates the pattern of a metal grating, and a second DSA process may be performed over the first layer to generate a second layer with an array, e.g., a hexagonal array.

Figure 6A:
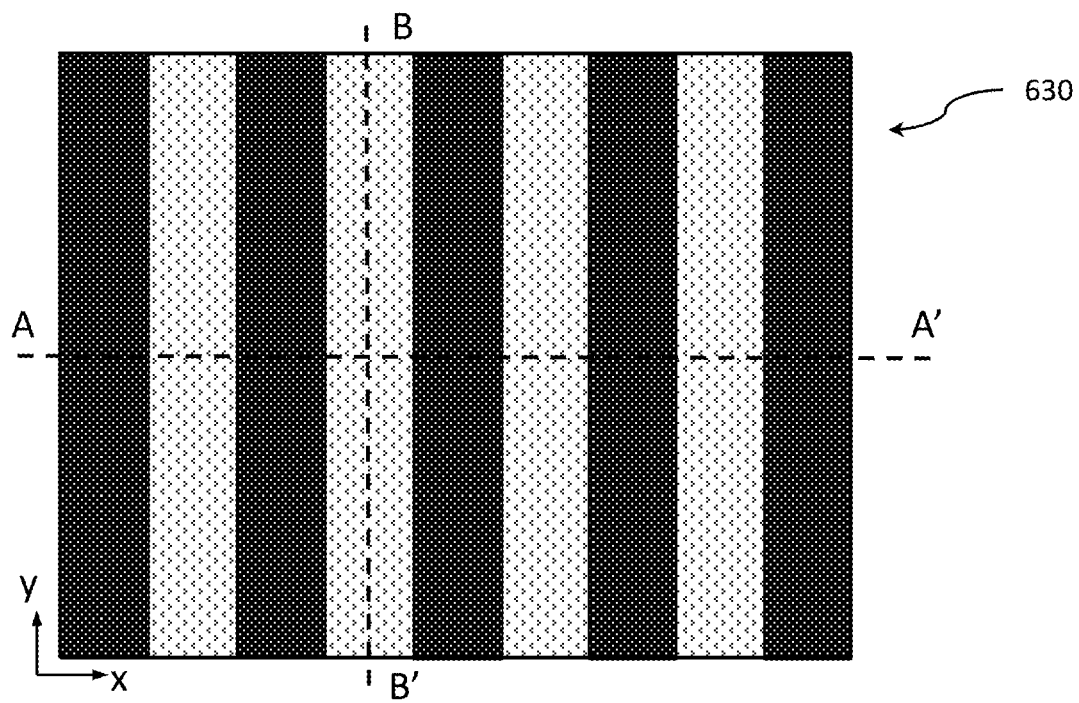
FIG. 6A-6F illustrate various stages in a process of generating an aligned hexagonal array over a pattern-replicating grating, according to some embodiments of the present disclosure.
Figure 6A:
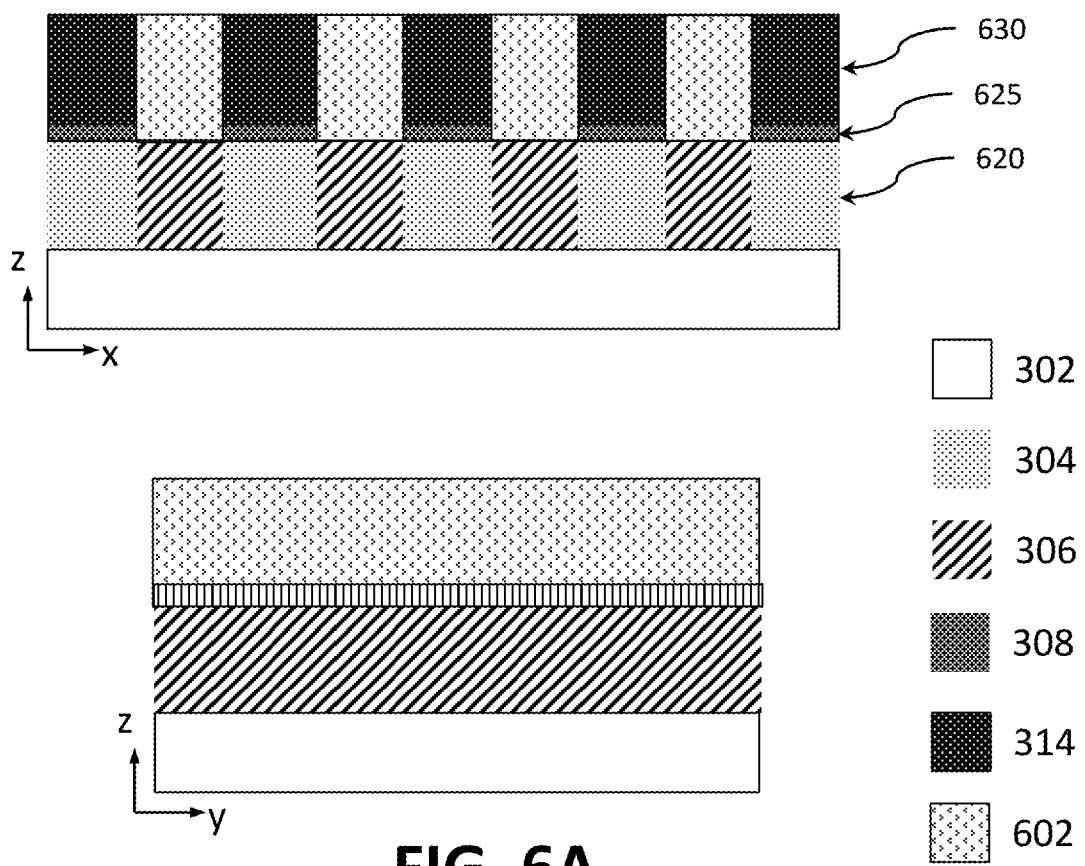

FIG. 6A-6F illustrate various stages in a process of generating an aligned hexagonal array over a grating-replicating layer, according to some embodiments of the present disclosure. FIG. 6A illustrates a grating replicating layer 630 formed using a DSA process over a metal grating 620. The metal grating 620 is similar to the metal grating 320 described with respect to FIG. 1. A guiding pattern 625 is formed over the metal grating 620. The guiding pattern 625 includes the first anchoring material 308 formed over the portions of insulator 304 in the metal grating 620. The guiding pattern 625 may also include the second anchoring material 310 formed over the portions of the electrically conductive material 306 in the metal grating 620, similar to the guiding pattern 330 shown in FIG. 3B.

A first solution of self-assembling diblock copolymer is deposited over the guiding pattern 625 and optionally annealed to form a striped pattern that replicates the metal grating 620. Unlike the diblock copolymer 312 described with respect to FIG. 3, the first diblock copolymer for generating the grating replicating layer 630 may have an equal ratio of a first polymer, e.g., polymer A, to a second copolymer, e.g., polymer B. In some embodiments, the first polymer and the second polymer may not have an equal ratio (e.g., if the width of the metal portions and insulator portions of the metal grating 620 are unequal), but the ratio of the polymers used to generate the grating replicating layer 630 is closer to an equal ratio than a diblock copolymer used to form a hexagonal pattern. While the same polymer A 314 is illustrated in the grating replicating layer, in other embodiments, a different first polymer and/or a different second polymer (e.g., selected from the list of polymers given above) may be used to form the grating replicating layer 630.

In the example shown in FIG. 6A, after the diblock copolymer self-assembles to form a striped pattern replicating the metal grating 320, polymer B is selectively etched and replaced by depositing a hard mask 602. The hard mask 602 may be an insulator that forms a suitable insulating layer in an IC device. In this example, polymer A 314 remains, but in other embodiments, polymer A 314 may be selectively etched and replaced with a second hard mask material, and in particular, a different hard mask material from the hard mask 602.

Figure 6B:
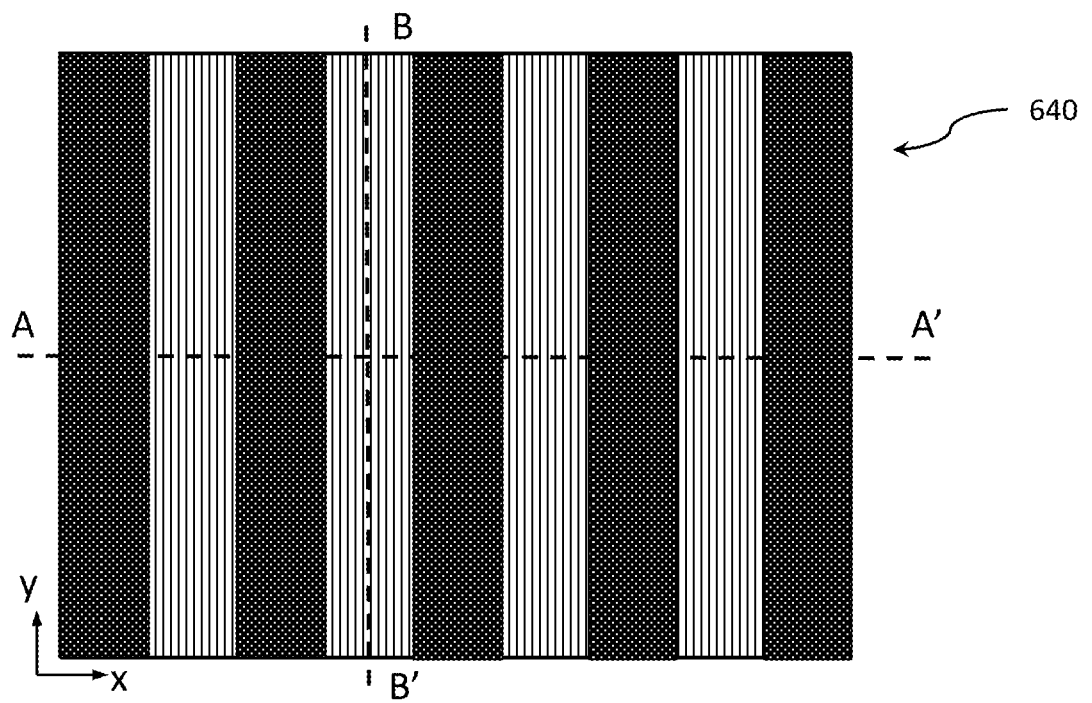
Figure 6B:
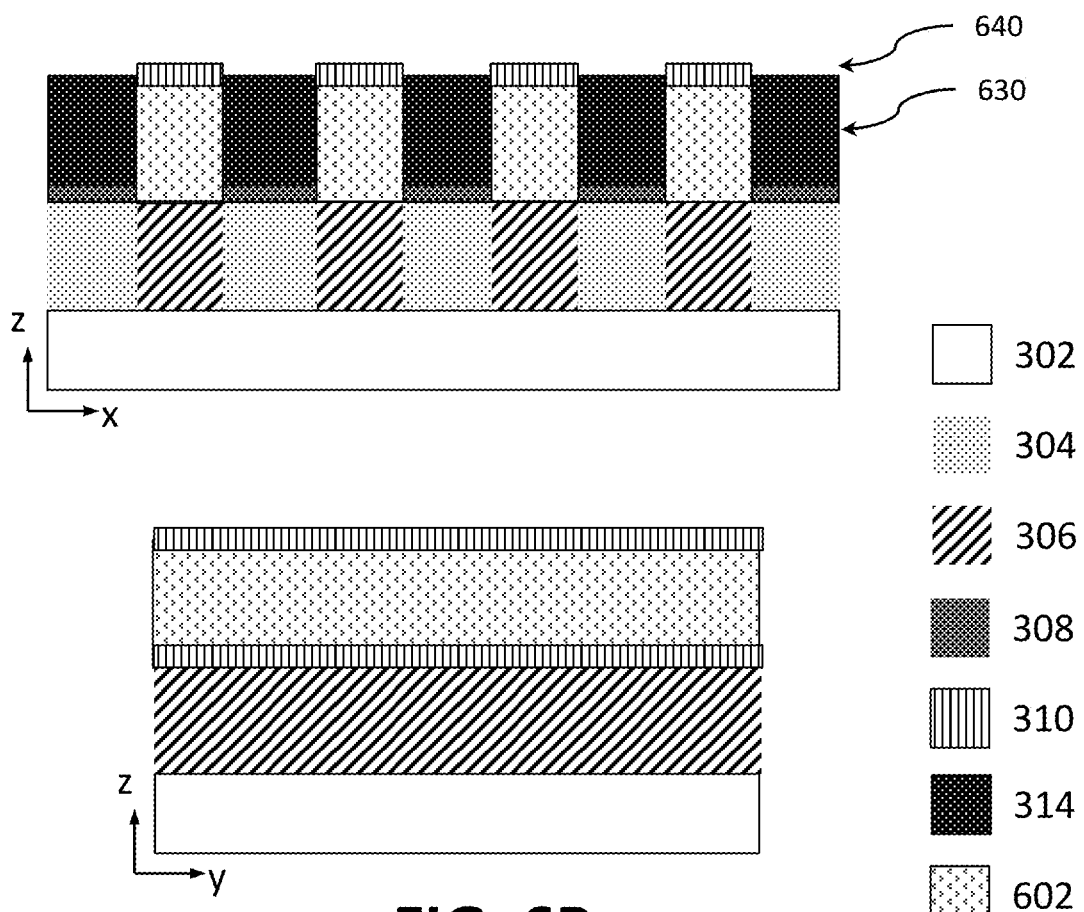

As depicted in FIG. 6B, a second guiding pattern 640 is deposited over the grating replicating layer 630. In this example, the second guiding pattern 640 includes stripes of the second anchoring material 310 formed over the portions of hard mask 602 in the grating replicating layer 630. The stripes of polymer A 314 in the grating replicating layer 630 may act as an anchoring material for a DSA layer formed over the grating replicating layer 630 and the second guiding pattern 640. Alternatively, if the polymer A 314 in the grating replicating layer 630 was etched and replaced by a second hard mask material, stripes of the first anchoring material 308 may be formed over the second hard mask material in the second guiding pattern 640. While the second guiding pattern 640 is shown as having a striped arrangement, in other embodiments, additional guiding features, such as the guiding dots or diagonal lines illustrated in FIGS. 4 and 5, may be included in the second guiding pattern 640.

After the second guiding pattern 640 is deposited, a solution of a diblock copolymer is deposited over the second guiding pattern 640. The diblock copolymer may be similar to the diblock copolymer 312 described with respect to FIG. 3. The diblock copolymer self-assembles, e.g., in response to an annealing treatment, to form the array 650 illustrated in FIG. 6C. The array 650 includes an array of cylinders in a hexagonal pattern, similar to the hexagonal array of cylinders 350 illustrated in FIG. 3D. The cylinders are aligned with the hard mask 602 in the grating replicating layer 630, which is aligned with the electrically conductive material 306 in the metal grating 620. Thus, the cylinders are aligned over the electrically conductive material 306, with the grating replicating layer 630 between the array 650 and the metal grating 620.

Figure 6C:
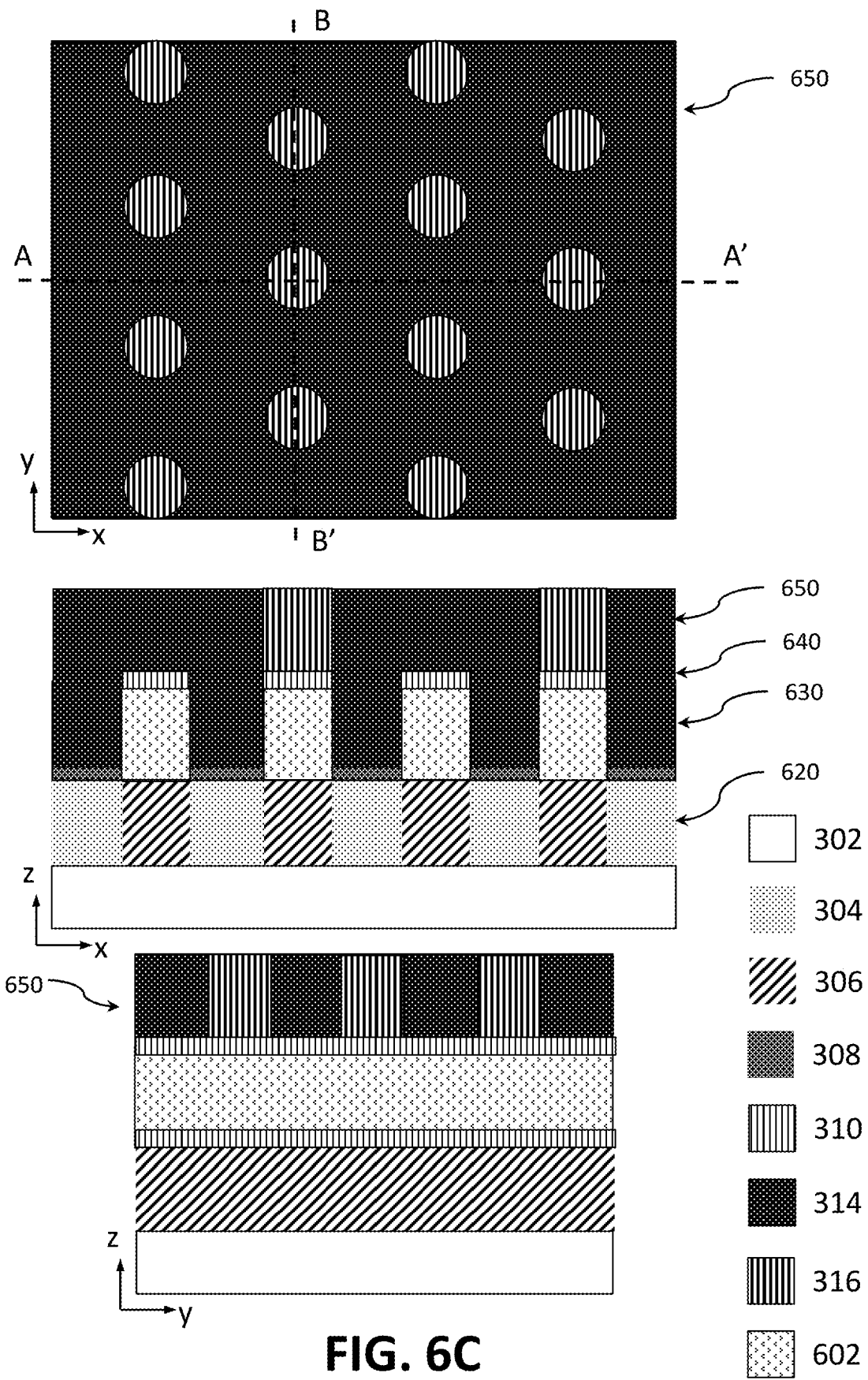

In the example shown in FIG. 6C, the array 650 includes cylinders formed from polymer B 316 within a layer of polymer A 314. Both the grating replicating layer 630 and the array layer include polymer A 314. In other embodiments, a different first polymer forming the bulk of the array layer and/or a different second polymer forming the cylinders (e.g., selected from the list of polymers given above) may be used to form the array 650.

Figure 6D:
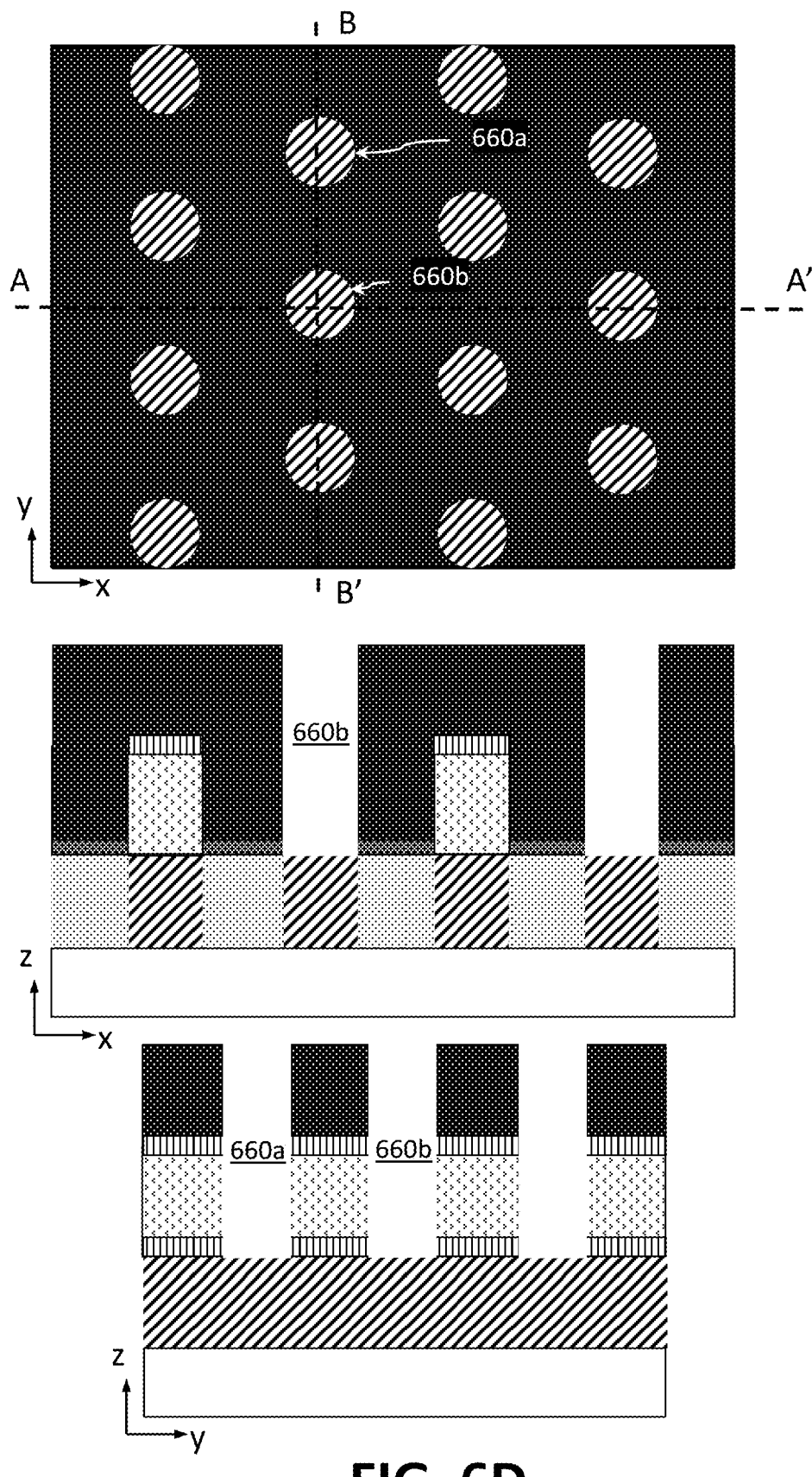

After the array 650 is formed, the process proceeds with etching polymer B 316, i.e., removing the polymer forming the cylinders of the array 650, and etching portions of the hard mask 602 under the etched regions of the array 650. FIG. 6D illustrates an example result of etching the polymer B regions and the hard mask 602. A multi-step etching process may be used, e.g., a first etching process to selectively etch polymer B 316, followed by a second etching process to selectively etch the exposed portions of the hard mask 602. In some embodiments, an additional etching process may be performed to selectively etch the exposed portions of the second anchoring material 310. Most or all of the polymer A 314 and the unexposed regions of the hard mask 602 may remain after the multi-step etching process. The etching process forms etched regions 660, also referred to as openings 660, e.g., the openings 660a and 660b labelled in FIG. 6D. The openings 660 have the same pattern as the cylinders in the array 650. For example, the openings 660 may have the locations, pitch, and diameters described with respect to the cylinders 350 of FIG. 3.

Figure 6E:
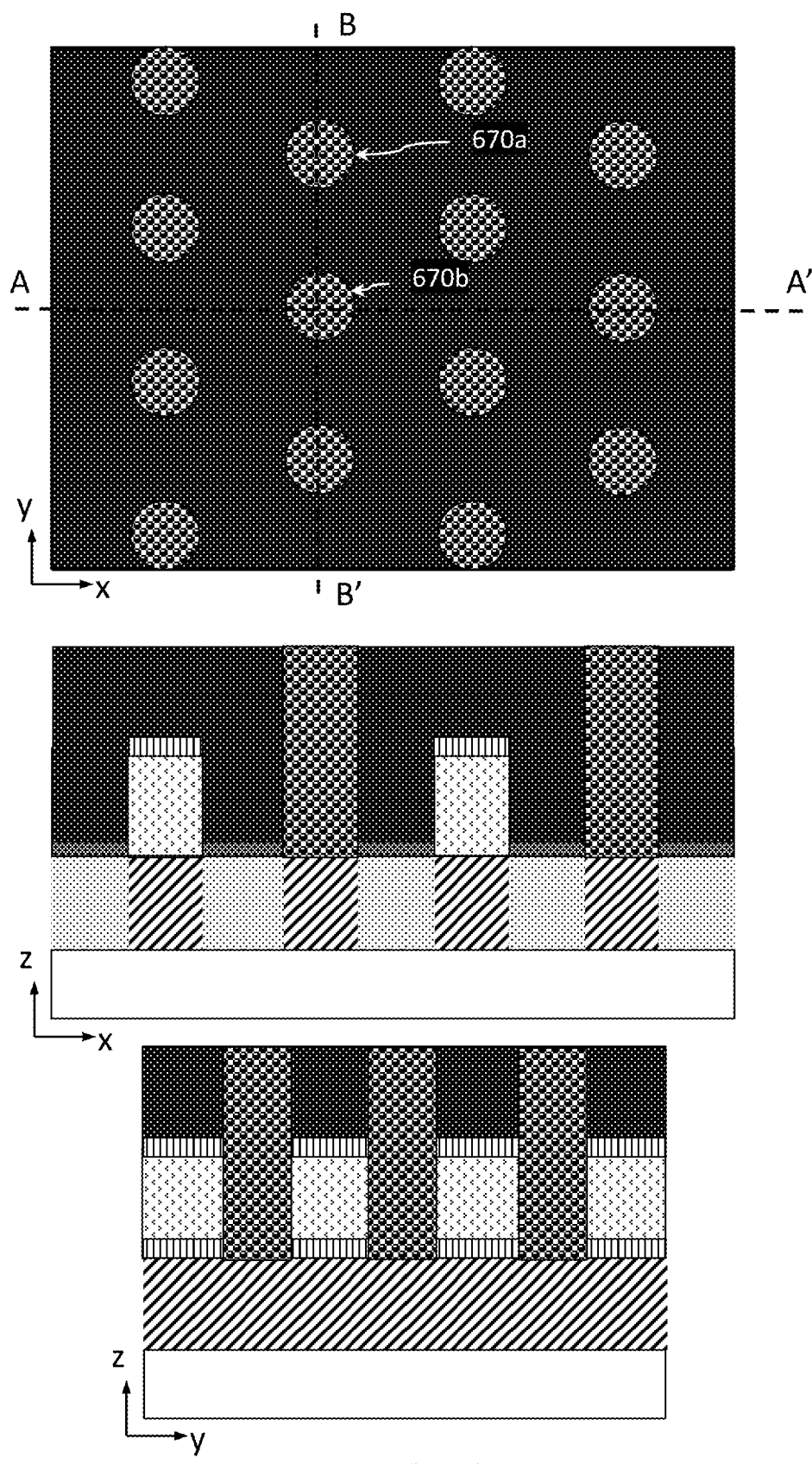

After forming the openings 660, the process may proceed with depositing a hard mask material into the openings 660. For example, as illustrated in FIG. 6E, the second hard mask material 392, described with respect to FIG. 3, may be deposited into the openings 660, forming cylindrical structures 670 of the second hard mask material 392. For example, the opening 660a is filled with a cylindrical hard mask structure 670a, and the opening 660b is filled with a cylindrical hard mask structure 670b.

Figure 6F:
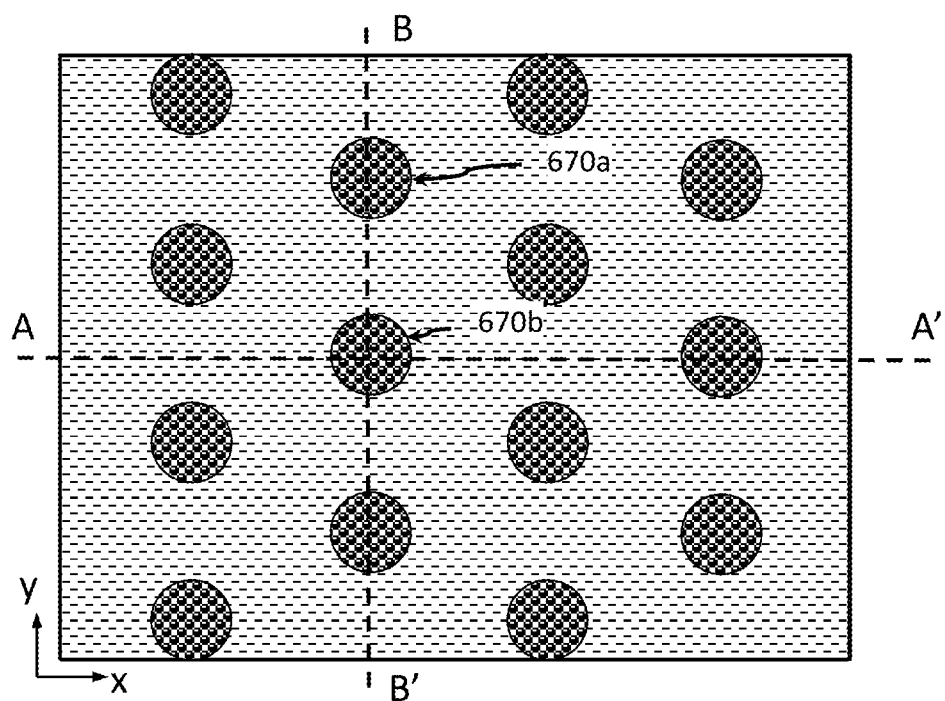
Figure 6F:
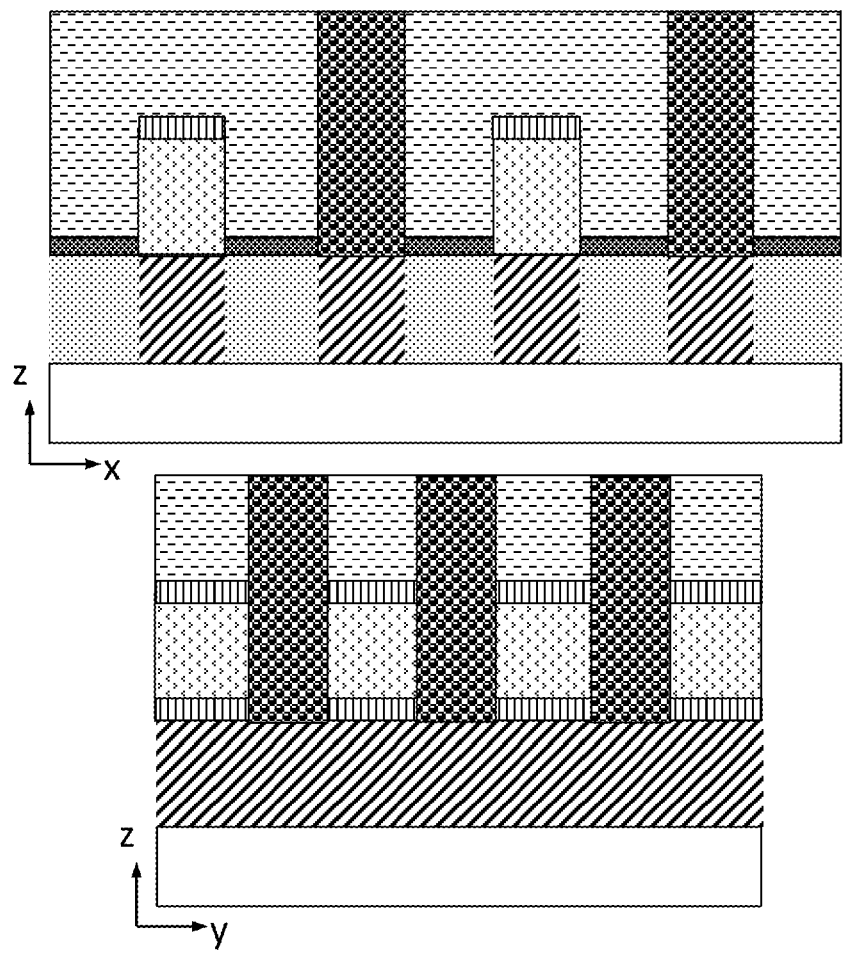

The process may proceed with converting polymer A 314 to a different hard mask material. For example, polymer A 314 may be etched and replaced with a hard mask, or polymer A 314 may be converted to a metal oxide, e.g., by sequential infiltration synthesis, vapor phase infiltration, or liquid phase infiltration. FIG. 6F illustrates an example result of replacing polymer A 314 with a hard mask, e.g., the first hard mask material 390 described with respect to FIG. 3. In this example, a layer of the hard mask 602 remains below hard mask A 390, i.e., hard mask 390 replaces polymer A 314, but not the hard mask 602 that was below polymer A 314. In other embodiments, the hard mask 602 may also be etched and replaced with hard mask A 390. While FIGS. 6E and 6F illustrate that polymer B 316 is converted to hard mask B 392 and then polymer A 314 is converted to hard mask B 390, in other embodiments, these processes may be performed in the opposite order.

After converting polymer A 314 and polymer B 316 to the hard mask materials 390 and 392, at least some of the cylindrical structures 670 formed of hard mask B 392 may be etched and replaced with via material, e.g., the conductive material 396, to form vias. Vias may be formed using a method similar to processes 210-218, described above with respect to FIG. 2 and FIGS. 3E-3J. In some embodiments, others of the cylindrical structures 670 formed of hard mask B 392 may be etched and replaced with an insulator material, e.g., the insulator material 398, to form plugs. Plugs may be formed using a method similar to process 220, described above with respect to FIG. 2 and FIG. 3K.

Additional Features of Aligned Arrays Formed Using a Guiding Pattern

The processes described above for generating arrays over guiding patterns using DSA can result in highly regular and well-aligned patterns and via placement. However, IC devices may exhibit certain physical characteristics in the area where the guided pattern was performed which may indicate that the guided DSA process described herein was used. Furthermore, IC devices may exhibit differences between a first region in which guided DSA was performed and a second region in which guided DSA was not performed, which can indicate the use of the guided DSA process in the first region.

Figure 7:
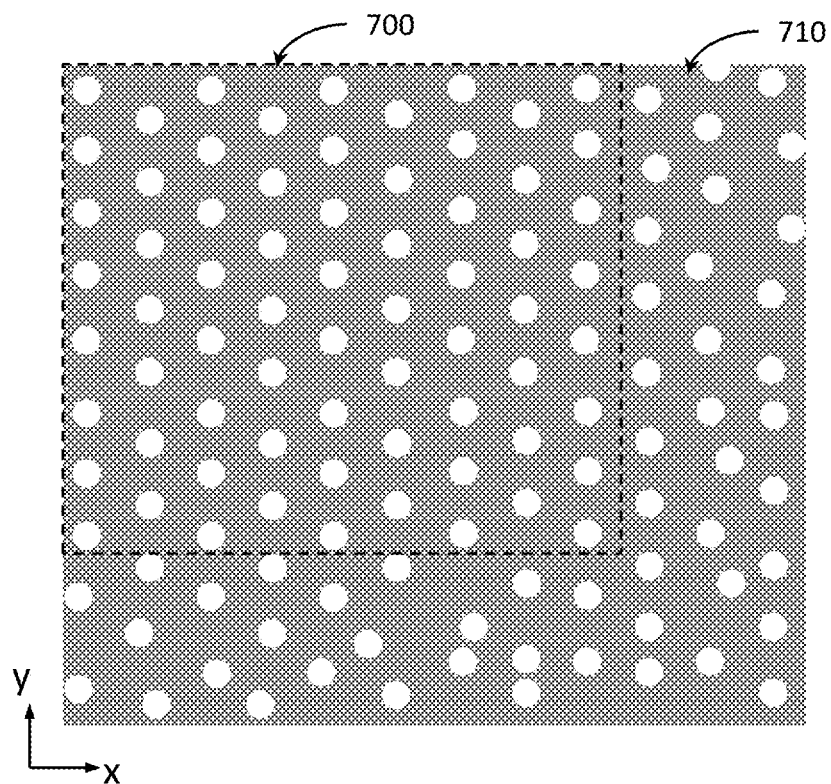
FIG. 7 illustrates a contrast between an aligned hexagonal region and a non-aligned hexagonal region, according to some embodiments of the present disclosure.

FIG. 7 illustrates a contrast between an aligned hexagonal region and a non-aligned hexagonal region, according to some embodiments of the present disclosure. In this example, the guiding pattern, e.g., any of the guiding patterns 330, 400, 500, or 640, may be formed over a first region 700 of a layer of an IC device, where the first region 700 is surrounded by a dashed box illustrated in FIG. 7. The guiding pattern is not formed over a second region 710 of the layer of the IC device, where the second region 710 is the region not surrounded by the dashed box. The first region 700 may correspond to an active area of an IC device, and the second region 710 may correspond to an inactive area of the IC device, such as a frame, guard etch, or guard ring.

In the first region 700, structures illustrated in white (e.g., a hexagonal array of vias) are formed within another material (e.g., an insulating material, illustrated in gray). In this example, the structures are arranged in a highly regular hexagonal array. The array of structures may be well-aligned to each other and well-aligned to a grating below the array of structures. For example, pitches between adjacent structures in the first region 700 all or mostly (e.g., 80%, 90%, or 95% of the pairs) may be within a certain error range of a target pitch, e.g., ±5% of the target pitch, ±10% of the target pitch, or ±20% of the target pitch. By contrast, in the second region 710, the structures have a roughly hexagonal pattern, but without the high level of regularity and alignment exhibited in the first region 700. As another example, the structures in the second region 710 may have a similar arrangement to the arrangement shown in FIG. 1. For example, pitches between at least a threshold number of pairs of adjacent structures in the second region 710 (e.g., greater than 10% of the pairs, or greater than 20% of the pairs) may be outside the error range of a target pitch, e.g., outside ±10% of the target pitch.

This contrast between the first region 700 and the second region 710 may indicate that the guiding pattern was applied and the DSA process performed over the first region 700, but that the guiding pattern was not applied in the second region 710. For example, the second region 710, which may be an inactive portion of the IC device, may not have the same underlying grating structure of the first region 700 to encourage the formation of the guiding pattern, as described with respect to FIGS. 2 and 3.

Figure 8:
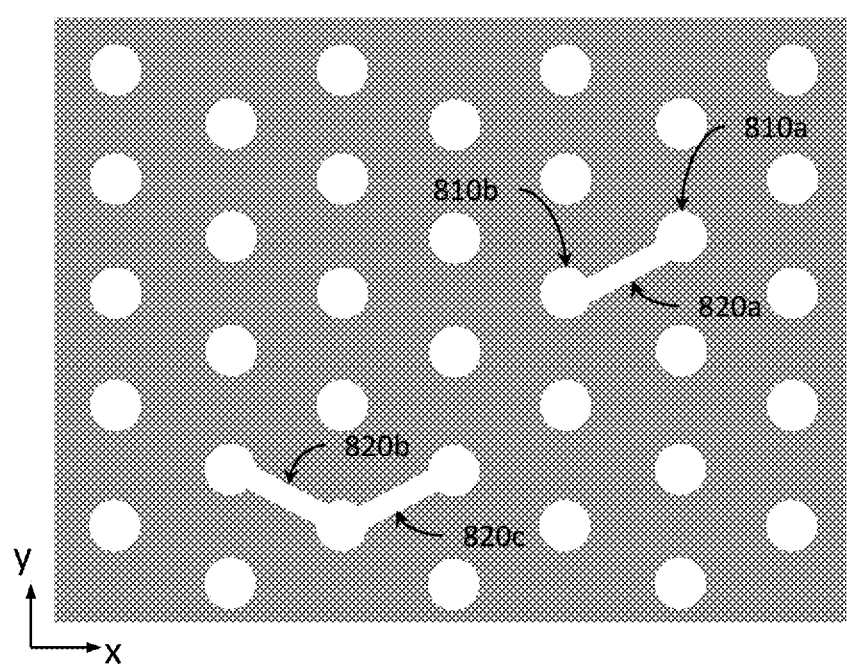
FIG. 8 illustrates an example line defect that may be exhibited by the guided array process, according to some embodiments of the present disclosure.

FIG. 8 illustrates an example line defect that may be exhibited by the guided array process, according to some embodiments of the present disclosure. In this example, cylindrical structures 810 (e.g., via structures) are formed using the guided array process described with respect to any of FIGS. 2-6. The cylindrical structures 810 are formed of one material illustrated in white (e.g., a via metal) and are formed within a layer of another material illustrated in gray (e.g., an insulator).

In some cases, a guided array process may result in an array of cylindrical structures in a highly regular pattern, as discussed with respect to FIGS. 2-7, but line defects connecting pairs of adjacent structures may be formed. One example line defect 820a is formed between the adjacent structures 810a and 810b. Two additional line defects 820b and 820c connect through the structure 810c. A line defect may occur if a linear region of polymer B 316 forms between two cylinders of polymer B 316, e.g., two of the cylinders 350. This linear region of polymer B is etched and filled with a via material, resulting in the line defect structures 820 illustrated in FIG. 8 in an IC structure. Thus, the line defect structures 820 may be formed of the same material is the cylindrical structures 810.

As illustrated in FIG. 8, the line defect structures 820 may have a width that is less than the diameter of the cylindrical structures 810. In other embodiments, the line defect structures 820 may have a width equal to or greater than the diameter of the cylindrical structures 810.

The line defect structures 820 may be observed in an active region in which the guided DSA process was performed (e.g., the first region 700 illustrated in FIG. 7) and/or an inactive region in which the guiding pattern was not used (e.g., the second region 710 illustrated in FIG. 7).

Figure 9:
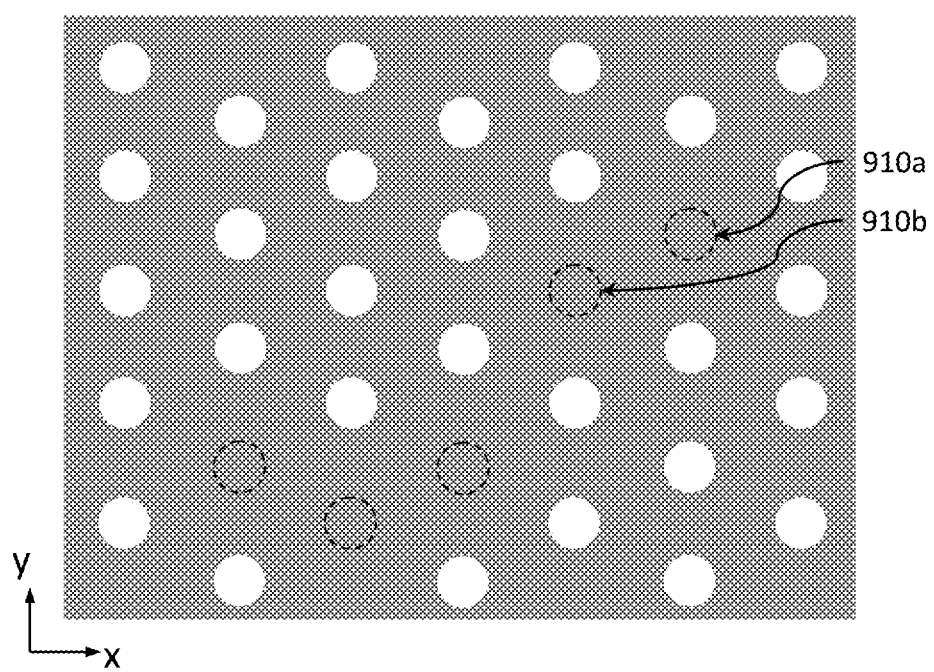
FIG. 9 illustrates an example array defect that may be exhibited by the guided array process, according to some embodiments of the present disclosure.

FIG. 9 illustrates an example array defect that may be exhibited by the guided array process, according to some embodiments of the present disclosure. In this example, cylindrical structures (e.g., via structures) are formed using the guided hexagonal array process described with respect to any of FIGS. 2-6. The cylindrical structures are formed of one material illustrated in white (e.g., a via metal) and are formed within a layer of another material illustrated in gray (e.g., an insulator).

In some cases, a guided array process may result in cylindrical structures having a highly regular pattern, as discussed with respect to FIGS. 2-7, but some subset of the expected cylindrical structures may not successfully form. For example, the polymer B may not completely span the DSA layer in the z-direction, e.g., if a line defect forms during the self-assembly. This can result in an array defect in which certain structures expected based on the hexagonal pattern are missing. The positions of the example array defects in FIG. 9 are illustrated by dashed circles, e.g., two adjacent array defects 910a and 910b are labelled in FIG. 9.

Example Electronic Devices

Layers of cylindrical via structures in an array formed using the guided array process described herein may be included in any suitable electronic device. FIGS. 10-14 illustrate various examples of devices and components that may include cylindrical structures, e.g., vias, deposited in an array, such as the hexagonal array as described herein.

Figure 10A:
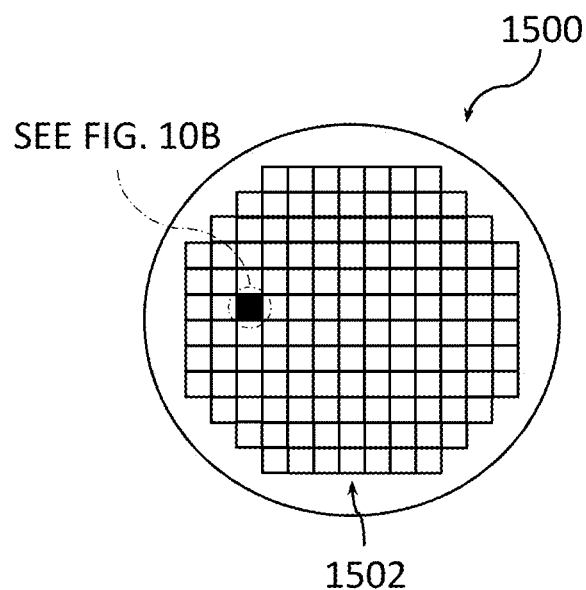
FIGS. 10A and 10B are top views of, respectively, a wafer and dies that may include vias deposited in a guided array, in accordance with any of the embodiments disclosed herein.
Figure 10B:
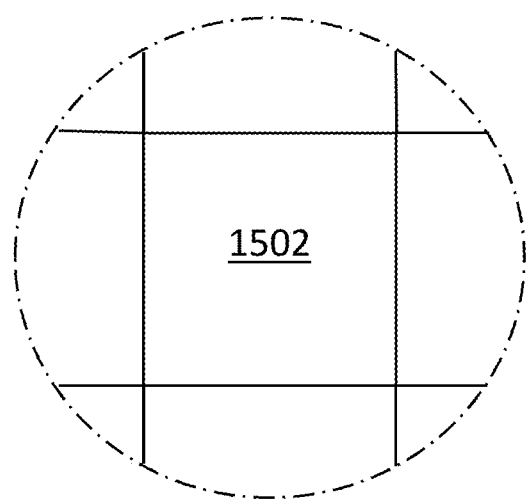

FIGS. 10A and 10B are top views of a wafer and dies that include one or more IC structures with devices including vias deposited in a guided array in accordance with any of the embodiments disclosed herein. The wafer 1500 may be composed of semiconductor material and may include one or more dies 1502 having IC structures formed on a surface of the wafer 1500. Each of the dies 1502 may be a repeating unit of a semiconductor product that includes any suitable IC structure (e.g., the IC structures as shown in any of FIG. 1, 2, or 4-6, or any further embodiments of the IC structures described herein). After the fabrication of the semiconductor product is complete (e.g., after manufacture of one or more IC structures with one or more devices including vias deposited in a guided array as described herein, included in a particular electronic component, e.g., in a transistor or in a memory device), the wafer 1500 may undergo a singulation process in which each of the dies 1502 is separated from one another to provide discrete "chips" of the semiconductor product. In particular, devices that include one or more devices that include vias deposited in a guided array as disclosed herein may take the form of the wafer 1500 (e.g., not singulated) or the form of the die 1502 (e.g., singulated). The die 1502 may include one or more transistors (e.g., one or more of the transistors 1640 of FIG. 11, discussed below) and/or supporting circuitry to route electrical signals to the transistors, as well as any other IC components (e.g., one or more devices that include vias deposited in a guided array). In some embodiments, the wafer 1500 or the die 1502 may include a memory device (e.g., an SRAM device), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 13) or other logic that is configured to store information in the memory devices or execute instructions stored in the memory array.

Figure 11:
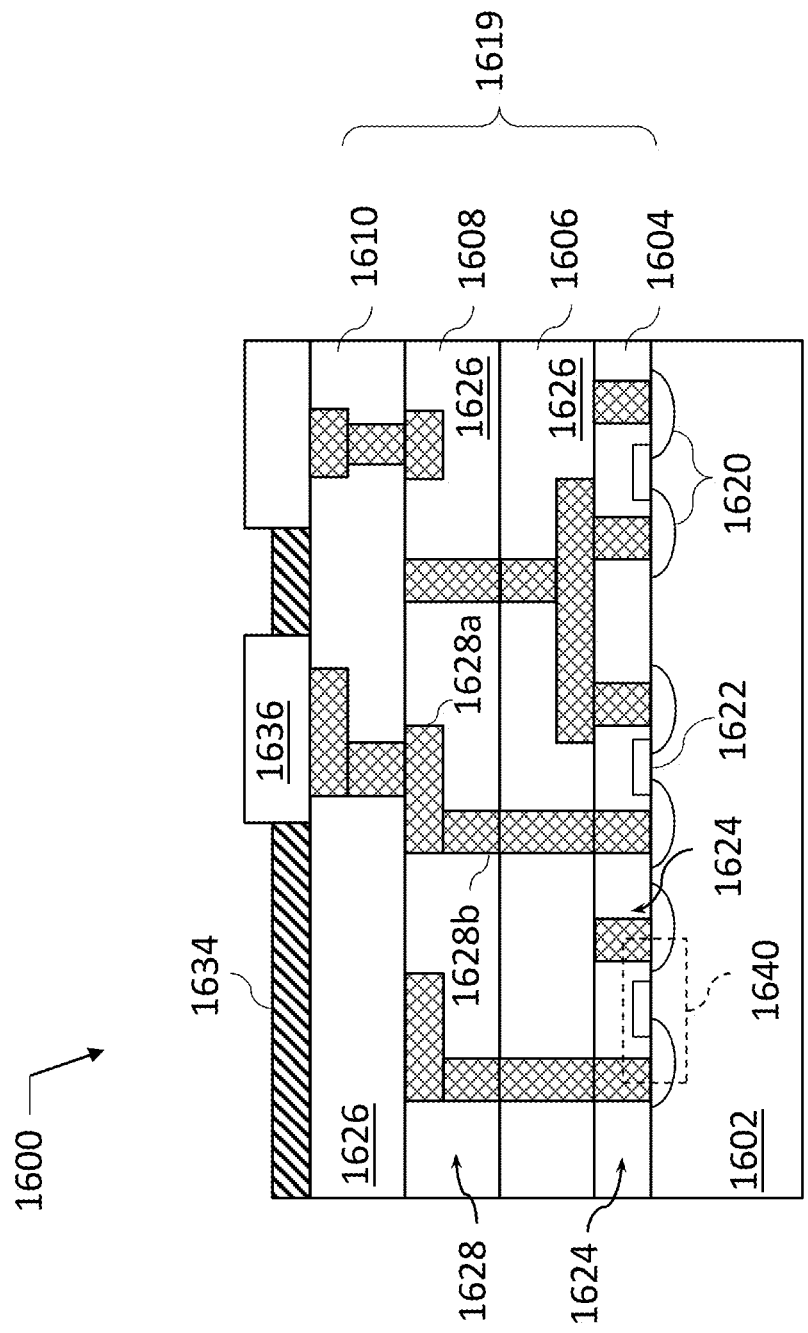
FIG. 11 is a cross-sectional side view of an IC package that may include vias deposited in a guided array, in accordance with any of the embodiments disclosed herein.

FIG. 11 is a cross-sectional side view of an IC device 1600 that may include one or more devices including vias deposited in a guided array in accordance with any of the embodiments disclosed herein. The IC device 1600 may be formed on a substrate 1602 (e.g., the wafer 1500 of FIG. 10A) and may be included in a die (e.g., the die 1502 of FIG. 10B). The substrate 1602 may be any substrate as described herein. The substrate 1602 may be part of a singulated die (e.g., the dies 1502 of FIG. 10B) or a wafer (e.g., the wafer 1500 of FIG. 10A).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 11 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate electrode layer and a gate dielectric layer.

The gate electrode layer may be formed on the gate interconnect support layer and may consist of at least one P-type workfunction metal or N-type workfunction metal, depending on whether the transistor is to be a PMOS or an NMOS transistor, respectively. In some implementations, the gate electrode layer may consist of a stack of two or more metal layers, where one or more metal layers are workfunction metal layers and at least one metal layer is a fill metal layer. Further metal layers may be included for other purposes, such as a barrier layer or/and an adhesion layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 electron Volts (eV) and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, aluminum carbide, tungsten, tungsten carbide. An N-type metal layer will enable the formation of an NMOS gate electrode with a workfunction that is between about 3.9 eV and about 4.2 eV.

In some embodiments, when viewed as a cross section of the transistor 1640 along the source-channel-drain direction, the gate electrode may be formed as a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may be implemented as a combination of U-shaped structures and planar, non-U-shaped structures. For example, the gate electrode may be implemented as one or more U-shaped metal layers formed atop one or more planar, non-U-shaped layers. In some embodiments, the gate electrode may consist of a V-shaped structure (e.g., when a fin of a FinFET transistor does not have a "flat" upper surface, but instead has a rounded peak).

Generally, the gate dielectric layer of a transistor 1640 may include one layer or a stack of layers, and the one or more layers may include silicon oxide, silicon dioxide, and/or a high-k dielectric material. The high-k dielectric material included in the gate dielectric layer of the transistor 1640 may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The S/D regions 1620 may be formed within the substrate 1602 adjacent to the gate 1622 of each transistor 1640, using any suitable processes known in the art. For example, the S/D regions 1620 may be formed using either an implantation/diffusion process or a deposition process. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion implantation process. In the latter process, an epitaxial deposition process may provide material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620. In some embodiments, an etch process may be performed before the epitaxial deposition to create recesses in the substrate 1602 in which the material for the S/D regions 1620 is deposited.

Electrical signals, such as power and/or input/output (I/O) signals, may be routed to and/or from the transistors 1640 of the device layer 1604 through one or more interconnect layers disposed on the device layer 1604 (illustrated in FIG. 11 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form an ILD stack 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 11). Although a particular number of interconnect layers 1606-1610 is depicted in FIG. 11, embodiments of the present disclosure include IC devices having more or fewer interconnect layers than depicted.

In some embodiments, the interconnect structures 1628 may include trench contact structures 1628*a* (sometimes referred to as "lines") and/or via structures 1628*b* (sometimes referred to as "holes") filled with an electrically conductive material such as a metal. The trench contact structures 1628*a* may be arranged to route electrical signals in a direction of a plane that is substantially parallel with a surface of the substrate 1602 upon which the device layer 1604 is formed. For example, the trench contact structures 1628*a* may route electrical signals in a direction in and out of the page from the perspective of FIG. 11. The via structures 1628*b* may be arranged to route electrical signals in a direction of a plane that is substantially perpendicular to the surface of the substrate 1602 upon which the device layer 1604 is formed. In some embodiments, the via structures 1628*b* may electrically couple trench contact structures 1628*a* of different interconnect layers 1606-1610 together.

The interconnect layers 1606-1610 may include a dielectric material 1626 disposed between the interconnect structures 1628, as shown in FIG. 11. The dielectric material 1626 may take the form of any of the embodiments of the dielectric material provided between the interconnects of the IC structures disclosed herein.

In some embodiments, the dielectric material 1626 disposed between the interconnect structures 1628 in different ones of the interconnect layers 1606-1610 may have different compositions. In other embodiments, the composition of the dielectric material 1626 between different interconnect layers 1606-1610 may be the same.

A first interconnect layer 1606 (referred to as Metal 1 or "M1") may be formed directly on the device layer 1604. In some embodiments, the first interconnect layer 1606 may include trench contact structures 1628*a* and/or via structures 1628*b*, as shown. The trench contact structures 1628*a* of the first interconnect layer 1606 may be coupled with contacts (e.g., the S/D contacts 1624) of the device layer 1604.

A second interconnect layer 1608 (referred to as Metal 2 or "M2") may be formed directly on the first interconnect layer 1606. In some embodiments, the second interconnect layer 1608 may include via structures 1628*b* to couple the trench contact structures 1628a of the second interconnect layer 1608 with the trench contact structures 1628a of the first interconnect layer 1606. Although the trench contact structures 1628a and the via structures 1628b are structurally delineated with a line within each interconnect layer (e.g., within the second interconnect layer 1608) for the sake of clarity, the trench contact structures 1628a and the via structures 1628b may be structurally and/or materially contiguous (e.g., simultaneously filled during a dual-damascene process) in some embodiments.

A third interconnect layer 1610 (referred to as Metal 3 or "M3") (and additional interconnect layers, as desired) may be formed in succession on the second interconnect layer 1608 according to similar techniques and configurations described in connection with the second interconnect layer 1608 or the first interconnect layer 1606.

The IC device 1600 may include a solder resist material 1634 (e.g., polyimide or similar material) and one or more bond pads 1636 formed on the interconnect layers 1606-1610. The bond pads 1636 may be electrically coupled with the interconnect structures 1628 and configured to route the electrical signals of the transistor(s) 1640 to other external devices. For example, solder bonds may be formed on the one or more bond pads 1636 to mechanically and/or electrically couple a chip including the IC device 1600 with another component (e.g., a circuit board). The IC device 1600 may have other alternative configurations to route the electrical signals from the interconnect layers 1606-1610 than depicted in other embodiments. For example, the bond pads 1636 may be replaced by or may further include other analogous features (e.g., posts) that route the electrical signals to external components.

Figure 12:
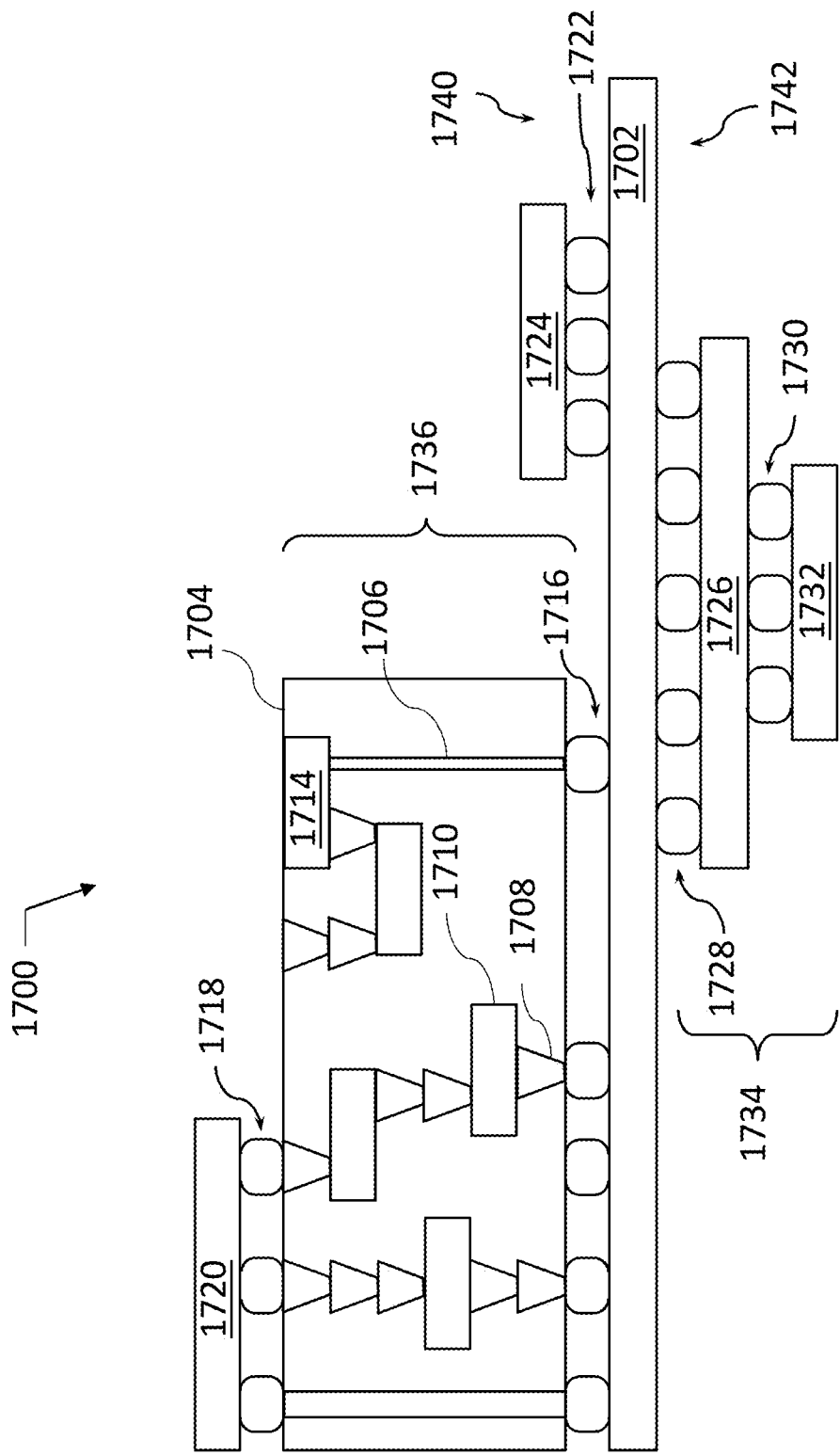
FIG. 12 is a cross-sectional side view of an IC device assembly that may include vias deposited in a guided array, in accordance with any of the embodiments disclosed herein.

FIG. 12 is a cross-sectional side view of an IC device assembly 1700 that may include components having or being associated with (e.g., being electrically connected by means of) one or more devices including vias deposited in a guided array accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. In particular, any suitable ones of the components of the IC device assembly 1700 may include any of the vias deposited in a guided array as disclosed herein.

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 12 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702 and may include solder balls (as shown in FIG. 12), male and female portions of a socket, an adhesive, an underfill material, and/or any other suitable electrical and/or mechanical coupling structure.

The package-on-interposer structure 1736 may include an IC package 1720 coupled to an interposer 1704 by coupling components 1718. The coupling components 1718 may take any suitable form for the application, such as the forms discussed above with reference to the coupling components 1716. Although a single IC package 1720 is shown in FIG. 12, multiple IC packages may be coupled to the interposer 1704; indeed, additional interposers may be coupled to the interposer 1704. The interposer 1704 may provide an intervening substrate used to bridge the circuit board 1702 and the IC package 1720. The IC package 1720 may be or include, for example, a die (the die 1502 of FIG. 10B), an IC device (e.g., the IC device 1600 of FIG. 11), or any other suitable component. In some embodiments, the IC package 1720 may include vias deposited in a guided hexagonal array, as described herein. Generally, the interposer 1704 may spread a connection to a wider pitch or reroute a connection to a different connection. For example, the interposer 1704 may couple the IC package 1720 (e.g., a die) to a ball grid array (BGA) of the coupling components 1716 for coupling to the circuit board 1702. In the embodiment illustrated in FIG. 12, the IC package 1720 and the circuit board 1702 are attached to opposing sides of the interposer 1704; in other embodiments, the IC package 1720 and the circuit board 1702 may be attached to a same side of the interposer 1704. In some embodiments, three or more components may be interconnected by way of the interposer 1704.

The interposer 1704 may be formed of an epoxy resin, a fiberglass-reinforced epoxy resin, a ceramic material, or a polymer material such as polyimide. In some implementations, the interposer 1704 may be formed of alternate rigid or flexible materials that may include the same materials described above for use in a semiconductor substrate, such as silicon, germanium, and other group III-V and group IV materials. The interposer 1704 may include metal interconnects 1708 and vias 1710, including but not limited to TSVs 1706. The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers, power management devices, antennas, arrays, sensors, and microelectromechanical systems (MEMS) devices may also be formed on the interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 12 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 13:
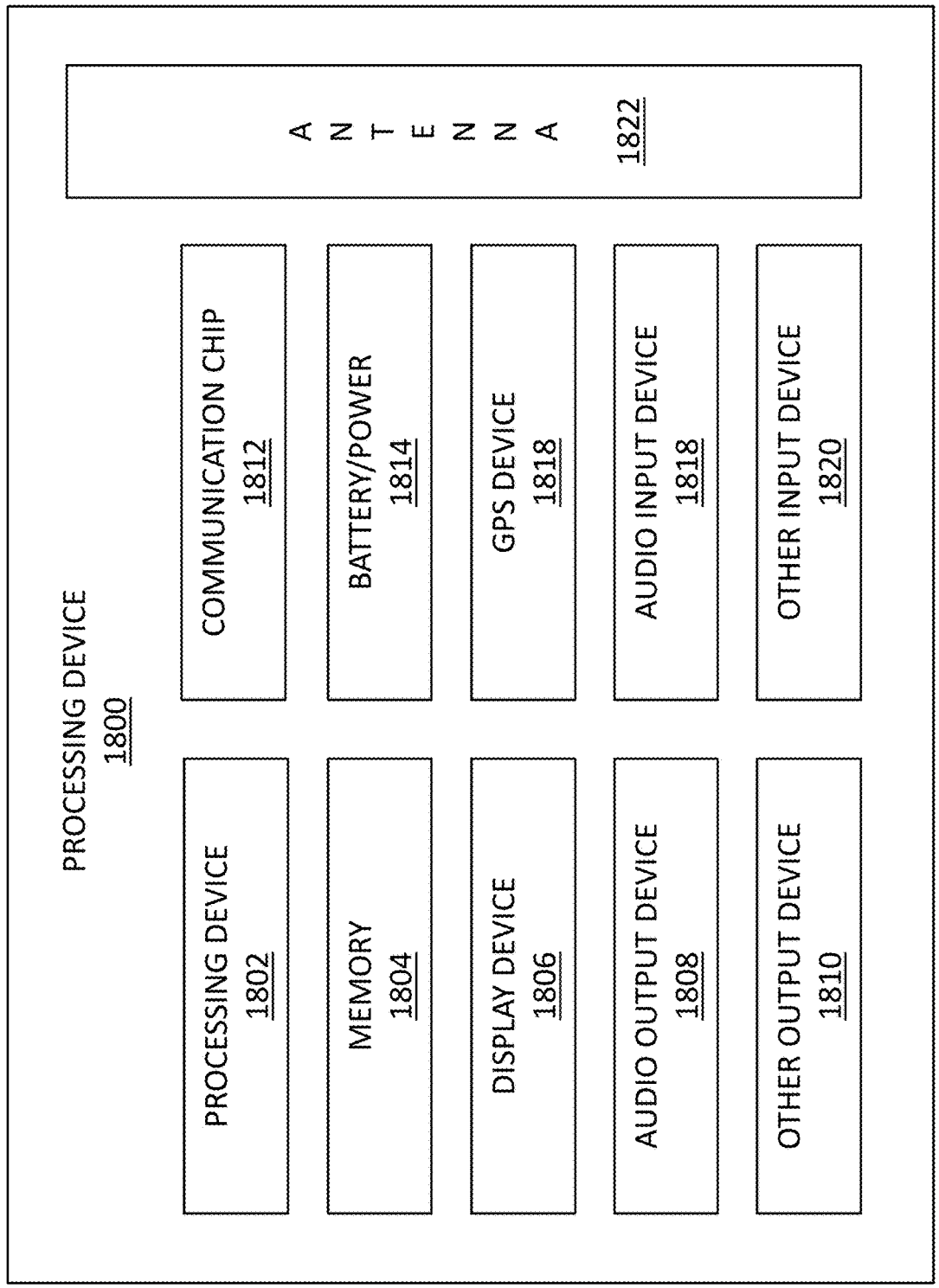
FIG. 13 is a block diagram of an example computing device that may include vias deposited in a guided array, in accordance with any of the embodiments disclosed herein.

FIG. 13 is a block diagram of an example computing device 1800 that may include one or more components including one or more devices including vias deposited in a guided array in accordance with any of the embodiments disclosed herein. For example, any suitable ones of the components of the computing device 1800 may include a die (e.g., the die 1502 of FIG. 10B) having vias deposited in a guided array as described herein. Any one or more of the components of the computing device 1800 may include, or be included in, an IC device 1600 (FIG. 11). Any one or more of the components of the computing device 1800 may include, or be included in, an IC device assembly 1700 (FIG. 12).

A number of components are illustrated in FIG. 13 as included in the computing device 1800, but any one or more of these components may be omitted or duplicated, as suitable for the application. In some embodiments, some or all of the components included in the computing device 1800 may be attached to one or more motherboards. In some embodiments, some or all of these components are fabricated onto a single system-on-a-chip (SoC) die.

Additionally, in various embodiments, the computing device 1800 may not include one or more of the components illustrated in FIG. 13, but the computing device 1800 may include interface circuitry for coupling to the one or more components. For example, the computing device 1800 may not include a display device 1806, but may include display device interface circuitry (e.g., a connector and driver circuitry) to which a display device 1806 may be coupled. In another set of examples, the computing device 1800 may not include an audio input device 1824 or an audio output device 1808 but may include audio input or output device interface circuitry (e.g., connectors and supporting circuitry) to which an audio input device 1824 or audio output device 1808 may be coupled.

The computing device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 1800 may include a memory 1804, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random-access memory (eDRAM) or spin transfer torque magnetic random-access memory (STT-MRAM).

In some embodiments, the computing device 1800 may include a communication chip 1812 (e.g., one or more communication chips). For example, the communication chip 1812 may be configured for managing wireless communications for the transfer of data to and from the computing device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The computing device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The computing device 1800 may include battery/power circuitry 1814. The battery/power circuitry 1814 may include one or more energy storage devices (e.g., batteries or capacitors) and/or circuitry for coupling components of the computing device 1800 to an energy source separate from the computing device 1800 (e.g., AC line power).

The computing device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display, for example.

The computing device 1800 may include an audio output device 1808 (or corresponding interface circuitry, as discussed above). The audio output device 1808 may include any device that generates an audible indicator, such as speakers, headsets, or earbuds, for example.

The computing device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The computing device 1800 may include a GPS device 1818 (or corresponding interface circuitry, as discussed above). The GPS device 1818 may be in communication with a satellite-based system and may receive a location of the computing device 1800, as known in the art.

The computing device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The computing device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1800 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 1800 may be any other electronic device that processes data.

SELECT EXAMPLES

The following paragraphs provide various examples of the embodiments disclosed herein.

Example 1 provides a method for hole patterning, the method including depositing a guiding pattern; depositing a solution of a diblock copolymer over the guiding pattern, the diblock copolymer including first polymer and a second polymer, the diblock copolymer having a greater concentration of the first polymer than the second polymer; annealing the diblock copolymer to generate a pattern in the first polymer and the second polymer, the pattern including a plurality of regions of the second polymer, the regions arranged in a regular pattern.

Example 2 provides the method of example 1, where the regions are arranged in a hexagonal pattern.

Example 3 provides the method of example 1 or 2, further including converting the plurality of regions of the second polymer to a hard mask; etching a region of the hard mask to form an etched region; and depositing metal into the etched region.

Example 4 provides the method of example 3, where the guiding pattern is deposited over a metal grating, the metal grating including a plurality of metal portions separated by a plurality of insulating portions.

Example 5 provides the method of example 4, where the etched region is over one of the metal portions of the metal grating, the metal deposited into the etched region forming a via.

Example 6 provides the method of examples 4 or 5, where the guiding pattern includes a first anchoring material and a second anchoring material, the first anchoring material adheres to the metal portions in the metal grating, and the second anchoring material adheres to the insulating portions in the metal grating.

Example 7 provides the method of any of the preceding examples, where annealing the deposited solution of the diblock copolymer generates the pattern using directed self-assembly (DSA) of the diblock copolymer.

Example 8 provides the method of any of the preceding examples, where the diblock copolymer has at least a 6:4 ratio of the first polymer to the second polymer.

Example 9 provides the method of any of the preceding examples, where the diblock copolymer has at least a 7:3 ratio of the first polymer to the second polymer.

Example 10 provides the method of any of the preceding examples, where the guiding pattern includes a first anchoring material that attracts the first polymer and a second anchoring material that attracts the second polymer.

Example 11 provides the method of example 10, where the first anchoring material and the second anchoring material are arranged in alternating stripes.

Example 12 provides the method of example 11, where the guiding pattern further includes a plurality of diagonal lines extending across the alternating stripes, the diagonal lines formed from the first anchoring material.

Example 13 provides the method of example 10, where the guiding pattern includes a plurality of guiding dots, the guiding dots corresponding to a subset of the plurality of regions forming the hexagonal pattern, the guiding dots formed from the second anchoring material.

Example 14 provides an IC device including a layer including a first material, the layer including an active area and an inactive area; and a plurality of structures formed in the active area of the layer and the inactive area of the layer, the structures including a second material different from the first material; where, in at least a portion of the active area, the plurality of structures are arranged in a regular pattern.

Example 15 provides the IC device of example 14, where, in at least a portion of the inactive area, the plurality of structures are arranged in an irregular pattern.

Example 16 provides the IC device of example 14 or 15, where, in the portion of the active area, the plurality of structures are arranged in a hexagonal pattern.

Example 17 provides the IC device of any of examples 14 to 16, where one of the plurality of structures in the active area has a diameter between 5 and 30 nanometers.

Example 18 provides the IC device of any of examples 14 to 17, where an adjacent pair of structures in the active area have a pitch between 10 and 60 nanometers.

Example 19 provides the IC device of any of examples 14 to 18, where, in the active area, pitches between adjacent structures of the plurality of structures arranged in the hexagonal pattern are within ±10% of a target pitch.

Example 20 provides the IC device of example 19, where, in the inactive area, pitches between at least a portion of adjacent structures vary by greater than ±10% of the target pitch.

Example 21 provides the IC device of any of examples 14 through 20, where the plurality of structures form vias extending through the layer to a second layer, the second layer under the layer.

Example 22 provides the IC device of any of examples 14 through 21, where the plurality of structures are a first set of structures, the IC device further including a second set of structures arranged in the regular pattern, the second set of structures formed from a third material different from the first material and the second material.

Example 23 provides the IC device of any of examples 14 through 22, where a pair of adjacent structures in the inactive area are connected by a line.

Example 24 provides an IC device including a layer including a first material; a plurality of structures formed in the layer, one of the plurality of structures including a second material different from the first material, and the plurality of structures arranged in a regular pattern, where an adjacent pair of the structures includes a first structure and a second structure; and a line connects the first structure and the second structure, the line formed from the second material.

Example 25 provides the IC device of example 24, where at least a portion of the plurality of structures are arranged in a hexagonal pattern.

Example 26 provides the IC device of example 24 or 25, where first structure has a first diameter, and the line has a width no greater than the first diameter.

Example 27 provides the IC device of any of examples 24 to 26, where the first structure and the second structure each have a diameter between 5 and 30 nanometers.

Example 28 provides the IC device of any of examples 24 through 27, where the first structure and the second structure have a pitch between 10 and 60 nanometers.

Example 29 provides the IC device of any of examples 24 to 28, where pitches between adjacent structures in the hexagonal pattern are within ±10% of a target pitch.

Example 30 provides the IC device of any of examples 24 through 29, where the plurality of structures form vias extending through the layer to a second layer, the second layer under the layer.

Example 31 provides the IC device of any of examples 24 through 30, where the plurality of structures arranged in the hexagonal pattern are in an active area of the layer, the layer further including an inactive area having a second plurality of structures, the second plurality of structures arranged in an irregular pattern.

Example 32 provides an IC device including a layer comprising a first insulator material; and a plurality of structures formed in the layer, the structures arranged in a hexagonal pattern, the plurality of structures including a first set of structures comprising a second insulator material different from the first insulator material, and a second set of structures comprising a conductive material.

Example 33 provides the IC device of example 32, where the layer is a first layer, the first layer is over a second layer including alternating conductive and non-conductive portions, and one of the second set of structures extends through the layer to a conductive portion of the second layer.

Example 34 provides the IC device of example 33, where one of the first set of structures extends into a conductive portion of the second layer.

Example 35 provides the IC device of any of examples 32 through 34, where the second insulator material includes silicon.

Example 36 provides the IC device of example 35, where the second insulator material further includes at least one of carbon, oxygen, or nitrogen.

Example 37 provides the IC device of any of examples 32 through 36, further including comprising an ILD layer over the layer, where the plurality of structures extend through the ILD layer.

Example 38 provides an IC package that includes an IC die, including one or more of the memory/IC devices according to any one of the preceding examples. The IC package may also include a further component, coupled to the IC die.

Example 39 provides the IC package according to example 38, where the further component is one of a package substrate, a flexible substrate, or an interposer.

Example 40 provides the IC package according to examples 38 or 39, where the further component is coupled to the IC die via one or more first level interconnects.

Example 41 provides the IC package according to example 40, where the one or more first level interconnects include one or more solder bumps, solder posts, or bond wires.

Example 42 provides a computing device that includes a circuit board; and an IC die coupled to the circuit board, where the IC die includes one or more of the memory/IC devices according to any one of the preceding examples (e.g., memory/IC devices according to any one of examples 14-36), and/or the IC die is included in the IC package according to any one of the preceding examples (e.g., the IC package according to any one of examples 38-41).

Example 43 provides the computing device according to example 42, where the computing device is a wearable computing device (e.g., a smart watch) or handheld computing device (e.g., a mobile phone).

Example 44 provides the computing device according to examples 42 or 43, where the computing device is a server processor.

Example 45 provides the computing device according to examples 42 or 43, where the computing device is a motherboard.

Example 46 provides the computing device according to any one of examples 41-45, where the computing device further includes one or more communication chips and an antenna.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. A device comprising:
a layer comprising an active area and an inactive area; and
a plurality of structures formed in the active area of the layer and the inactive area of the layer,
wherein one of the plurality of structures in the active area has a diameter between 5 and 30 nanometers, a first adjacent pair of structures in the active area have a target pitch between 10 and 60 nanometers, and a second adjacent pair of structures in the inactive area have a pitch that varies by greater than ±10% of the target pitch.

2. The device of claim 1, wherein, in the active area, pitches between adjacent structures of the plurality of structures are within ±10% of the target pitch.

3. The device of claim 1, wherein the layer comprises a first material, a first portion of the structures comprise a second material different from the first material, and a second portion of the structures comprises a third material different from the first material and the second material.

4. The device of claim 3, wherein the second material is a conductor, and the third material is an insulator.

5. The device of claim 1, wherein the layer is a first layer, and the plurality of structures extend through the first layer to a second layer under the first layer.

6. The device of claim 5, wherein the second layer comprises a metal grating, and the plurality of structures are in contact with metal portions of the metal grating.

7. The device of claim 1, wherein the plurality of structures have cylindrical shapes.

8. The device of claim 7, further comprising a via coupled to a top side of one of the plurality of structures, wherein the via tapers towards the top side of the structure.

9. A device comprising:
a layer comprising a first material; and
a plurality of structures formed in the layer, the plurality of structures arranged in a hexagonal pattern, wherein:
a first structure and a second structure of the plurality of structures comprise a second material different from the first material,
the first structure is adjacent to the second structure in the hexagonal pattern, and
a line formed from the second material connects the first structure and the second structure, wherein the line is within the layer comprising the first material and the plurality of structures.

10. The device of claim 9, wherein the first structure has a first diameter, and the line has a width no greater than the first diameter.

11. The device of claim 9, wherein the first structure and the second structure each have a diameter between 5 and 30 nanometers.

12. The device of claim 9, wherein the first structure and the second structure have a pitch between 10 and 60 nanometers.

13. The device of claim 9, wherein pitches between adjacent structures in the hexagonal pattern are within ±10% of a target pitch.

14. The device of claim 9, wherein a second line connects the first structure to a third structure, the second line and the third structure formed from the second material.

15. The device of claim 9, wherein the plurality of structures arranged in the hexagonal pattern are in an active area of the layer, the layer further comprising an inactive area having a second plurality of structures, the second plurality of structures arranged in an irregular pattern.

16. An assembly comprising:
a first component; and
a second component coupled to the first component, the second component comprising:
a layer having an active area and an inactive area; and
a plurality of structures formed in the active area of the layer and the inactive area of the layer,
wherein, in the active area, pitches between adjacent structures of the plurality of structures are within ±10% of a target pitch, and in the inactive area, pitches between at least a portion of the adjacent structures vary by greater than ±10% of the target pitch.

17. The assembly of claim 16, wherein the layer comprises a first material, a first portion of the plurality of structures comprise a second material different from the first material, and a second portion of the plurality of structures comprises a third material different from the first material and the second material.

18. The assembly of claim 16, wherein the plurality of the structures have cylindrical shapes.

19. The device of claim 1, wherein the active area corresponds to a region of the device comprising active circuitry.

20. The device of claim 1, wherein the inactive area comprises a frame, a guard etch, or a guard ring.

\* \* \* \* \*